US012701699B2

(12) United States Patent
Ahn et al.

(10) Patent No.: US 12,701,699 B2
(45) Date of Patent: Aug. 4, 2026

(54) SEMICONDUCTOR MEMORY DEVICE AND ELECTRONIC SYSTEM INCLUDING THE SAME

(71) Applicant: Samsung Electronics Co., Ltd.,
Suwon-si (KR)

(72) Inventors: Jae Ho Ahn, Seoul (KR); Ji Won Kim,
Seoul (KR); Sung-Min Hwang,
Hwaseong-si (KR); Joon-Sung Lim,
Seongnam-si (KR); Suk Kang Sung,
Seongnam-si (KR)

(73) Assignee: SAMSUNG ELECTRONICS CO.,
LTD., Suwon-si (KR)

( * ) Notice: Subject to any disclaimer, the term of this
patent is extended or adjusted under 35
U.S.C. 154(b) by 455 days.

(21) Appl. No.: 18/386,639

(22) Filed: Nov. 3, 2023

(65) Prior Publication Data

US 2024/0064974 A1     Feb. 22, 2024

Related U.S. Application Data

(63) Continuation of application No. 17/340,148, filed on
Jun. 7, 2021, now Pat. No. 11,844,211.

(30) Foreign Application Priority Data

Oct. 15, 2020     (KR) ........................ 10-2020-0133115

(51) Int. Cl.
*H10B 41/27*     (2023.01)
*H10B 43/27*     (2023.01)
(Continued)
(52) U.S. Cl.
CPC .............. *H10B 41/27* (2023.02); *H10B 43/27*
(2023.02); *H10W 70/611* (2026.01); *H10W*
*70/635* (2026.01); *H10W 90/00* (2026.01)

(58) Field of Classification Search
CPC ....... H10B 43/27; H10B 43/50; H10W 20/42;
H10W 20/20; H10W 20/43; H10W 90/00;
H10W 70/635
See application file for complete search history.

(56) References Cited

U.S. PATENT DOCUMENTS 9,558,945 B2     1/2017  Fukuzumi et al.
9,601,577 B1     3/2017  Lee et al.
(Continued)

OTHER PUBLICATIONS

Office Action dated Oct. 9, 2024, from the Korean Intellectual
Property Office for corresponding application No. KR 10-2020-
0133115.

*Primary Examiner* — John M Parker
(74) *Attorney, Agent, or Firm* — Muir Patent Law, PLLC

(57) ABSTRACT

A semiconductor memory device comprising: a first semi-
conductor chip including an upper input/output pad, a sec-
ond semiconductor chip including a lower input/output pad,
and a substrate attachment film attaching the first and second
semiconductor chips. The first and second semiconductor
chips each include a first substrate including a first side
facing the substrate attachment film and a second side, a
mold structure including gate electrodes, a channel structure
penetrating the mold structure and intersecting the gate
electrodes, a second substrate including a third side facing
the first side and a fourth side, a first circuit element on the
third side of the second substrate, and a contact via pen-
etrating the first substrate and connected to the first circuit
element. The upper and lower input/output pads are on the
second sides of the first and second semiconductor chip,
respectively, and contact the contact vias of the first and
second semiconductor chips.

20 Claims, 19 Drawing Sheets

(51) Int. Cl.
    *H10W 70/60*     (2026.01)
    *H10W 70/63*     (2026.01)
    *H10W 90/00*     (2026.01)

(56)         References Cited

U.S. PATENT DOCUMENTS

| | | | |
|---|---|---|---|
| 10,026,769 | B2 | 7/2018 | Kagawa et al. |
| 10,306,372 | B2 | 5/2019 | Zou et al. |
| 10,354,980 | B1 | 7/2019 | Mushiga et al. |
| 10,510,738 | B2 | 12/2019 | Kim et al. |
| 10,651,153 | B2 | 5/2020 | Fastow et al. |
| 2016/0079164 | A1 | 3/2016 | Fukuzumi et al. |
| 2016/0233264 | A1 | 8/2016 | Kagawa et al. |
| 2017/0104068 | A1 | 4/2017 | Lee et al. |
| 2018/0358371 | A1 | 12/2018 | Hwang et al. |
| 2019/0296041 | A1 | 9/2019 | Yamasaka et al. |
| 2020/0098786 | A1 | 3/2020 | Park et al. |
| 2020/0152573 | A1* | 5/2020 | Oh ..................... H10W 20/427 |
| 2020/0258816 | A1 | 8/2020 | Okina et al. |
| 2021/0407968 | A1 | 12/2021 | Kim et al. |
| 2022/0310541 | A1 | 9/2022 | Na et al. |

\* cited by examiner

SEMICONDUCTOR MEMORY DEVICE AND ELECTRONIC SYSTEM INCLUDING THE SAME

CROSS-REFERENCE TO RELATED APPLICATION

This application is a continuation of U.S. patent application Ser. No. 17/340,148, filed on Jun. 7, 2021, which claims priority from Korean Patent Application No. 10-2020-0133115, filed on Oct. 15, 2020, in the Korean Intellectual Property Office, and all the benefits accruing therefrom under 35 U.S.C. § 119, the entire contents of both of which are herein incorporated by reference.

BACKGROUND

1. Technical Field

The present disclosure relates to a semiconductor memory device and an electronic system including the same. More specifically, the present disclosure relates to a semiconductor memory device including stacked semiconductor chips and an electronic system including the same.

2. Description of the Related Art

In order to fulfill high performance and low price required by consumers, there is a need to increase the degree of integration of semiconductor memory devices. In the case of the semiconductor memory devices, since the degree of integration is an important factor in determining the price of products, an increased degree of integration is particularly desired.

In the case of a two-dimensional or planar semiconductor memory device, the degree of integration is mainly determined by an area occupied by unit memory cells, and is therefore greatly affected by the level of fine pattern forming technology. However, because ultra-expensive apparatuses are required for miniaturization of pattern, the degree of integration of the two-dimensional semiconductor memory devices is increasing, but is still restricted. As a result, three-dimensional semiconductor memory devices equipped with memory cells arranged three-dimensionally has been proposed.

On the other hand, with the development of the electronic industry, there are increasing demands for higher functionality, higher speed, and miniaturization of electronic components. In response to such a tendency, a semiconductor package in which a plurality of semiconductor chips is stacked and mounted on a single package substrate may be used.

SUMMARY

Aspects of the present disclosure provide a semiconductor memory device that is easy to design, can be miniaturized, and has improved reliability.

Aspects of the present disclosure also provide an electronic system including a semiconductor memory device that is easy to design, can be miniaturized, and has improved reliability.

According to an aspect of the present inventive concept, there is provided a semiconductor memory device comprising: a first semiconductor chip including an upper input/output pad, a second semiconductor chip including a lower input/output pad, and a substrate attachment film which attaches the first semiconductor chip and the second semiconductor chip, wherein each of the first semiconductor chip and the second semiconductor chip further includes a first substrate which includes a first side facing the substrate attachment film and a second side opposite to the first side, a mold structure including a plurality of gate electrodes stacked sequentially on the first side of the first substrate, a channel structure which penetrates the mold structure and intersects the plurality of gate electrodes, a second substrate which includes a third side facing the first side and a fourth side opposite to the third side, a first circuit element on the third side of the second substrate, and a contact via which penetrates the first substrate and is connected to the first circuit element, the substrate attachment film attaches the second substrate of the first semiconductor chip, and the second substrate of the second semiconductor chip, the upper input/output pad is placed on the second side of the first semiconductor chip and contacts the contact via of the first semiconductor chip, and the lower input/output pad is placed on the second side of the second semiconductor chip and contacts the contact via of the second semiconductor chip.

According to another aspect of the present inventive concept, there is provided a semiconductor memory device comprising: a first semiconductor chip including an upper input/output pad, and a second semiconductor chip including a lower input/output pad and attached to the first semiconductor chip, wherein each of the first semiconductor chip and the second semiconductor chip further includes a first substrate including a first side and a second side opposite to each other, a mold structure including a plurality of gate electrodes stacked sequentially on the first side of the first substrate, and a channel structure which penetrates the mold structure and intersects the plurality of gate electrodes, a second substrate including a third side facing the first side and a fourth side opposite to the third side, and a contact via penetrating the first substrate, the fourth side of the first semiconductor chip faces the fourth side of the second semiconductor chip, the upper input/output pad is connected to the contact via of the first semiconductor chip, and the lower input/output pad is connected to the contact via of the second semiconductor chip.

According to another aspect of the present inventive concept, there is provided an electronic system comprising: a main board, a semiconductor memory device on the main board, and a controller which is electrically connected to the semiconductor memory device on the main board, wherein the semiconductor memory device includes a first semiconductor chip including an upper input/output pad, and a second semiconductor chip including a lower input/output pad and attached to the first semiconductor chip, each of the first semiconductor chip and the second semiconductor chip includes a first substrate including a first side and a second side opposite to each other, a mold structure including a plurality of gate electrodes stacked sequentially on the first side of the first substrate, a channel structure which penetrates the mold structure and intersects the plurality of gate electrodes, a second substrate including a third side facing the first side and a fourth side opposite to the third side, and a contact via penetrating the first substrate, the fourth side of the first semiconductor chip faces the fourth side of the second semiconductor chip, the contact via of the first semiconductor chip is connected to the controller through the upper input/output pad, and the contact via of the second semiconductor chip is connected to the controller through the lower input/output pad.

However, aspects of the present disclosure are not restricted to the one set forth herein. These and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which like numerals refer to like elements throughout. In the drawings:

FIG. 2b is an enlarged view for explaining a region R1 of FIG. 2a.

FIGS. 3a and 3b are various enlarged views for explaining a region R2 of FIG. 2a.

FIG. 4 is an enlarged view for explaining a region R3 of FIG. 2a.

DETAILED DESCRIPTION OF THE EMBODIMENTS

Hereinafter, a semiconductor memory device according to exemplary embodiments will be described referring to FIGS. 1 to 10.

As used herein, terms such as "same," "equal," "planar," or "coplanar," when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal,"

or "substantially planar," may be exactly the same, equal, or planar, or may be the same, equal, or planar within acceptable variations that may occur, for example, due to manufacturing processes.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 1:
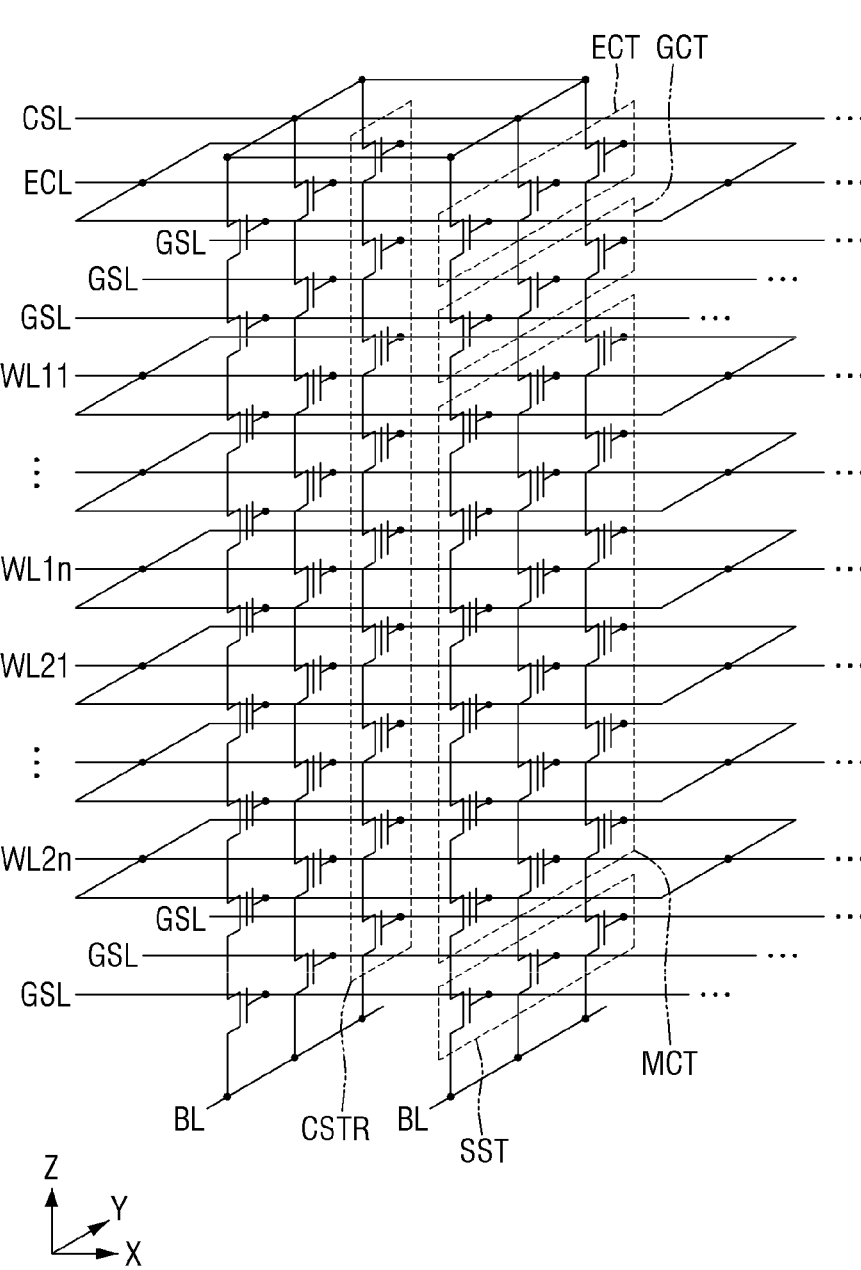
FIG. 1 is an exemplary circuit diagram for explaining a semiconductor memory device, according to some embodiments.

FIG. 1 is an exemplary circuit diagram for explaining a semiconductor memory device according to some embodiments.

A memory cell array of the semiconductor memory device according to some embodiments may include a common source line CSL, a plurality of bit lines BL, and a plurality of cell strings CSTR.

The common source line CSL may extend in a first direction X. In some embodiments, a plurality of common source lines CSL may be placed two-dimensionally. For example, a plurality of common source lines CSL may be spaced apart from each other and each may extend in the first direction X. Electrically the same voltage may be applied to the common source lines CSL or different voltages are applied to the common source lines CSL and the common source lines CSL may be controlled separately.

A plurality of bit lines BL may be placed two-dimensionally. For example, the bit lines BL may be spaced apart from each other and extend in a second direction Y that intersects the first direction X. A plurality of cell strings CSTR may be connected to each bit line BL in parallel. The cell strings CSTR may be connected in common to the common source line CSL. That is, a plurality of cell strings CSTR may be placed between the bit lines BL and the common source line CSL.

Each cell string CSTR may include a ground selection transistor GST connected to the common source line CSL, a string selection transistor SST connected to the bit line BL, and a plurality of memory cell transistors MCT placed between the ground selection transistor GST and the string selection transistor SST. Each memory cell transistor MCT may include a data storage element. The ground selection transistor GST, the string selection transistor SST and the memory cell transistor MCT may be connected in series.

The common source line CSL may be connected in common to sources of the ground selection transistor GST. Also, a ground selection line GSL, a plurality of word lines WL11 to WL1$n$ and WL21 to WL2$n$, and the string selection line SSL may be placed between the common source line CSL and the bit line BL. The ground selection line GSL may be used as a gate electrode of the ground selection transistor GST, the word lines WL11 to WL1$n$ and WL21 to WL2$n$ may be used as a gate electrode of the memory cell transistors MCT, and the string selection line SSL may be used as a gate electrode of the string selection transistor SST.

In some embodiments, an erasure control transistor ECT may be placed between the common source line CSL and the ground selection transistor GST. The common source line CSL may be connected in common to the sources of the erasure control transistors ECT. Also, an erasure control line ECL may be placed between the common source line CSL and the ground selection line GSL. The erasure control line ECL may be used as the gate electrode of the erasure control transistor ECT. The erasure control transistors ECT may generate a gate induced drain leakage (GIDL) to execute the erasure operation of the memory cell array.

Figure 2A:
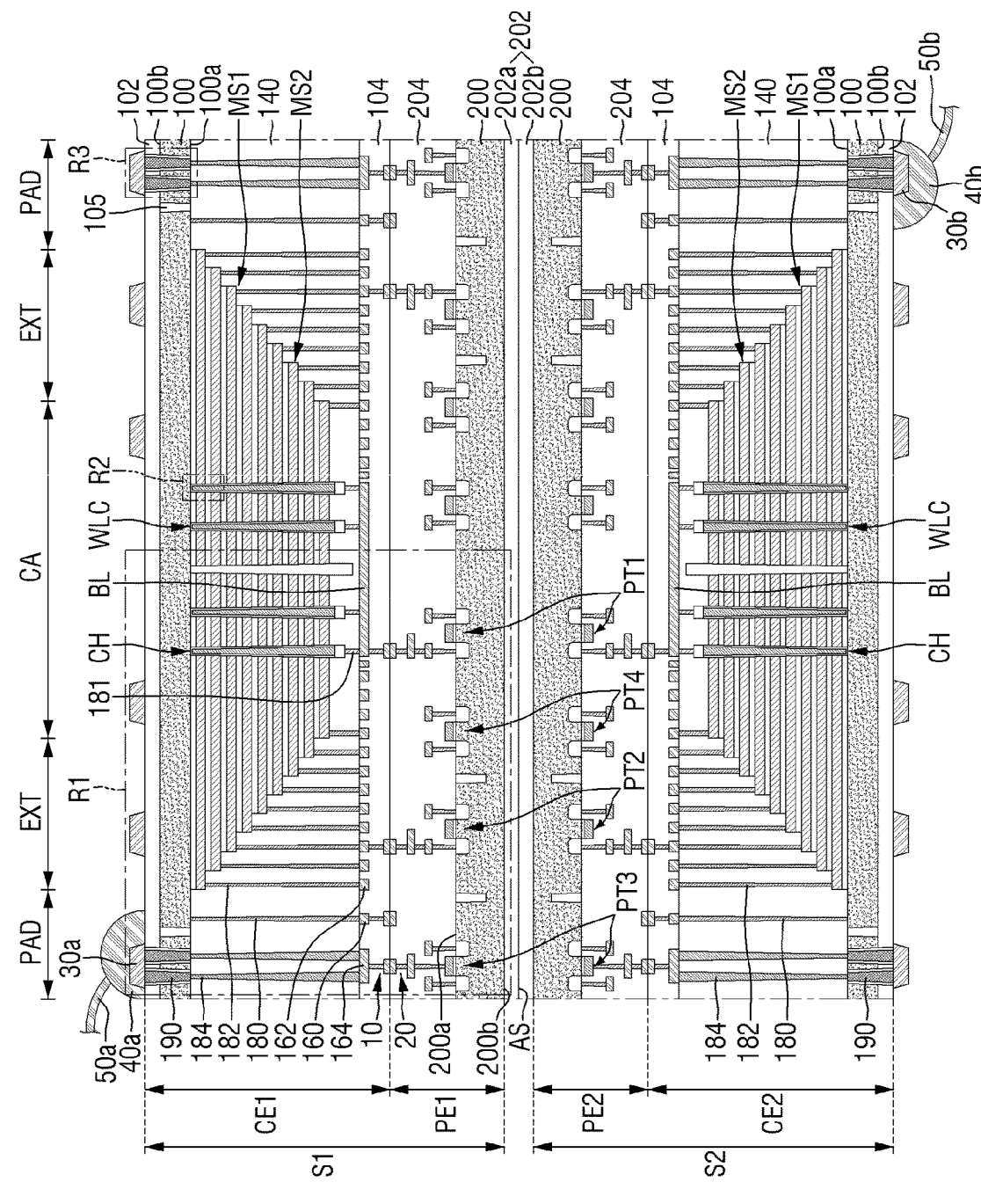
FIG. 2a is a schematic cross-sectional view for explaining a semiconductor memory device, according to some embodiments.
Figure 2B:
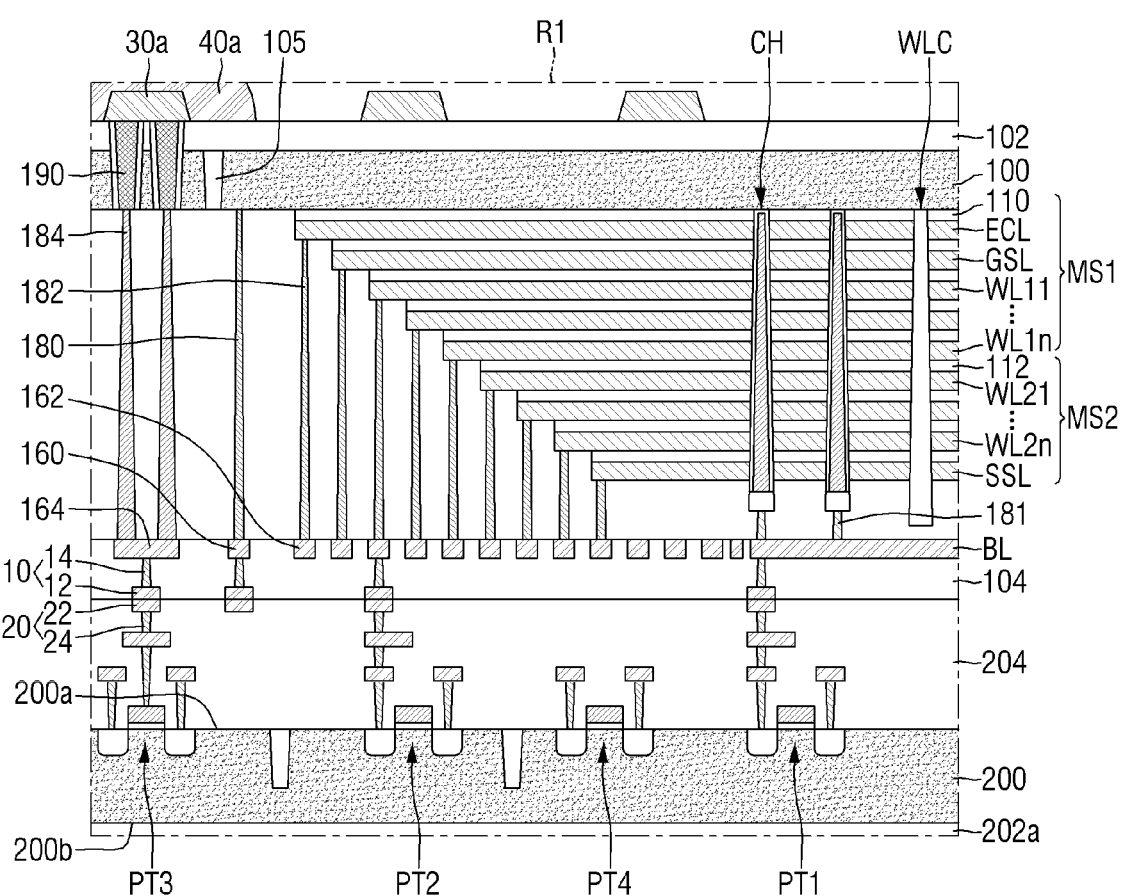
Figure 3A:
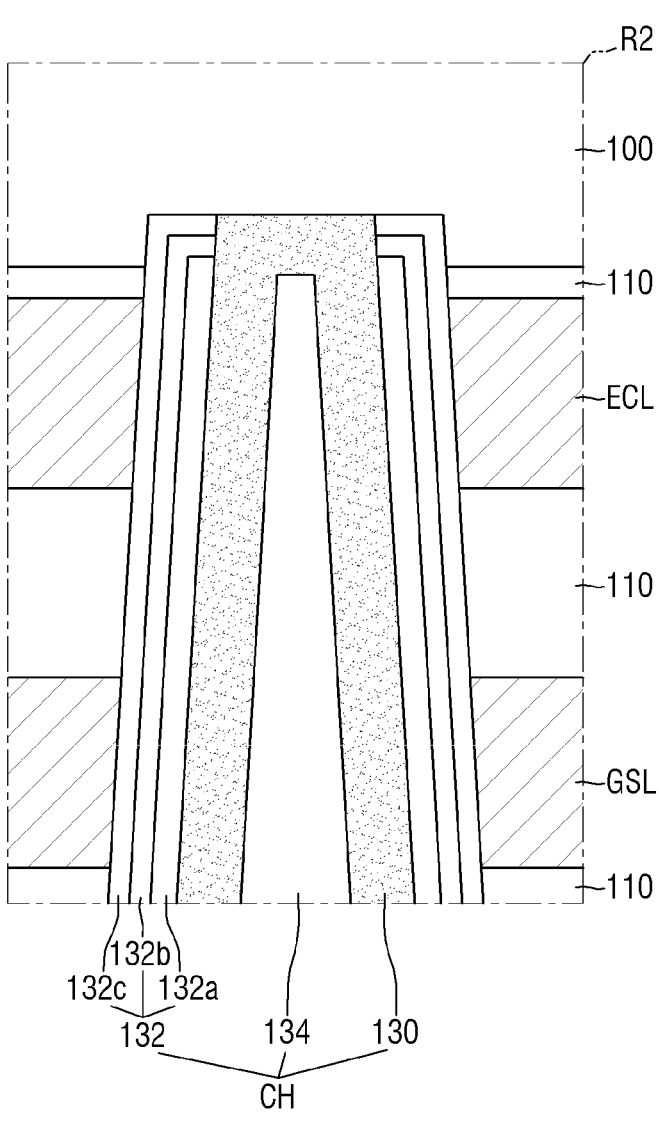
Figure 3B:
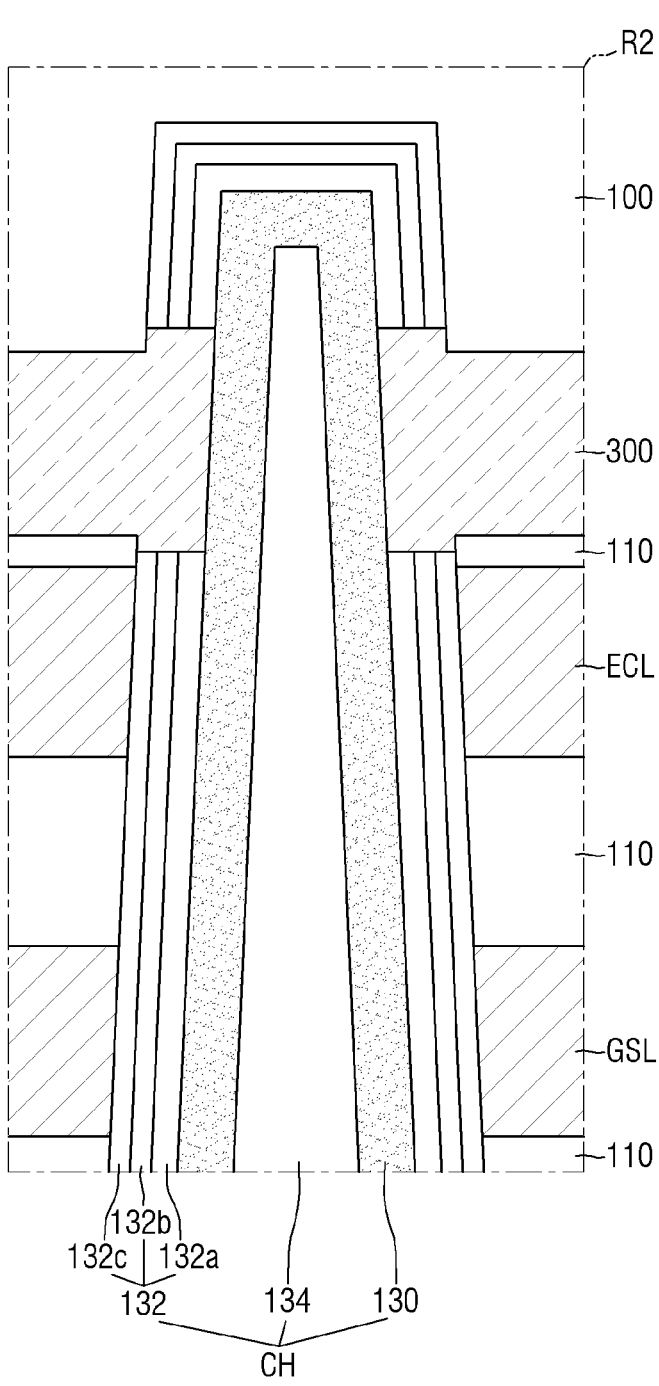
Figure 4:
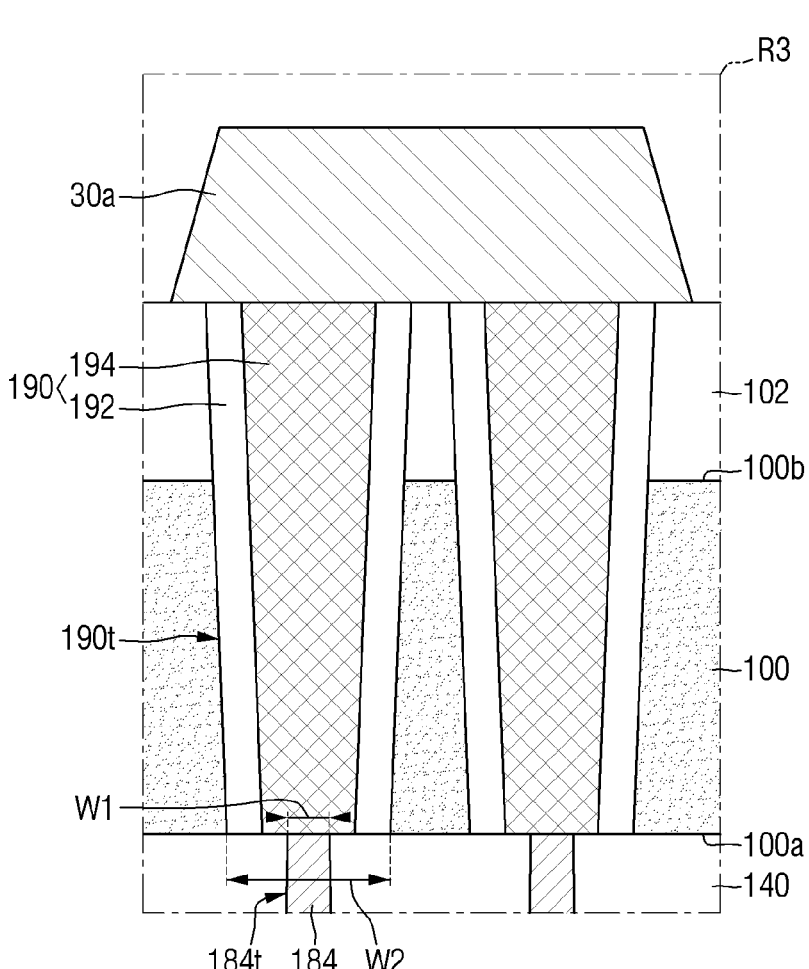

FIG. 2a is a schematic cross-sectional view for explaining a semiconductor memory device according to some embodiments. FIG. 2b is an enlarged view for explaining a region R1 of FIG. 2a. FIGS. 3a and 3b are various enlarged views for explaining a region R2 of FIG. 2a. FIG. 4 is an enlarged view for explaining a region R3 of FIG. 2a.

Referring to FIGS. 2a to 4, the semiconductor memory device according to some embodiments may include a first semiconductor chip S1, a second semiconductor chip S2, and a substrate attachment film 202.

The first semiconductor chip S1 may include a first cell structure CE1 and a first peri structure PE1. A second semiconductor chip S2 may include a second cell structure CE2 and a second peri structure PE2.

The first cell structure CE1 and the second cell structure CE2 may each provide a memory cell array including at least one memory block. For example, each of the first cell structure CE1 and the second cell structure CE2 may include a first substrate 100, mold structures MS1 and MS2, an interlayer insulating film 140, a plurality of channel structures CH, a bit line BL, a block isolation region WLC, a first through via 184, a contact via 190, and a first wiring structure 10, which will be described later.

The first pen structure PE1 and the second pen structure PE2 may each provide a peripheral circuit that controls the operation of the memory cell array. For example, the first pen structure PE1 and the second pen structure PE2 may each include a second substrate 200, a plurality of circuit elements PT1 to PT4, and a second wiring structure 20, which will be described later.

In some embodiments, the first semiconductor chip S1 and the second semiconductor chip S2 may be substantially the same or identical semiconductor chips. For example, the first semiconductor chip S1 and the second semiconductor chip S2 may be semiconductor chips manufactured by the same fabricating process.

The first substrate 100 may include, for example, a semiconductor substrate such as a silicon substrate, a germanium substrate, or a silicon-germanium substrate. Or, the first substrate 100 may include a silicon-on-insulator (SOI) substrate, a germanium-on-insulator (GOI) substrate, or the like.

The first substrate 100 may include a first side 100a and a second side 100b opposite to each other. In some embodiments, the first side 100a of the first substrate 100 may face a substrate attachment film 202 to be described below. Also, the first substrate 100 may include a cell array region CA, an extension region EXT and a pad region PAD.

A memory cell array including a plurality of memory cells may be formed in the cell array region CA. A plurality of memory cells, a plurality of channel structures CH electrically connected to each of the memory cells, a plurality of word lines WL11 to WL1n and WL21 to WL2n, a plurality of bit lines BL, and the like may be placed in the memory cell array.

The extension region EXT may be placed around the cell array region CA. A plurality of gate electrodes ECL, GSL, WL11 to WL1n, WL21 to WL2n, and SSL to be described later may be stacked in the extension region EXT in the form of a step structure.

The pad region PAD may be placed around the cell array region CA and the extension region EXT. For example, the pad region PAD may surround the cell array region CA and the extension region EXT from a planar viewpoint. An upper input/output pad 30a and a lower input/output pad 30b, which will be described below, may be placed in the pad region PAD.

The mold structures MS1 and MS2 may be formed on the first side 100a of the first substrate 100. The mold structures MS1 and MS2 may include a plurality of gate electrodes ECL, GSL, WL11 to WL1n, WL21 to WL2n, and SSL which are sequentially stacked on the first side 100a of the first substrate 100.

In some embodiments, the mold structures MS1 and MS2 may include a first mold structure MS1 and a second mold structure MS2 that are sequentially stacked on the first side 100a of the first substrate 100.

The first mold structure MS1 may be formed on the first substrate 100. The first mold structure MS1 may include a plurality of first mold insulating films 110 and a plurality of first gate electrodes ECL, GSL, and WL11 to WL1n that are alternately stacked on the first substrate 100. For example, each of the first gate electrodes ECL, GSL and WL11 to WL1n and each first mold insulating film 110 may be a layered structure extending in a direction parallel to an upper side (e.g., for example, the first side 100a) of the first substrate 100. Further, the first gate electrodes ECL, GSL, and WL11 to WL1n and the first mold insulating film 110 may be stacked alternately along a direction intersecting (for example, perpendicular to) the upper side of the first substrate 100.

In some embodiments, the first gate electrodes ECL, GSL, and WL11 to WL1n may include an erasure control line ECL, a ground selection line GSL and a plurality of first word lines WL11 to WL1n which are stacked sequentially on the first substrate 100. Unlike those shown, the erasure control line ECL may be omitted in some embodiments.

The second mold structure MS2 may be formed on the first mold structure MS1. The second mold structure MS2 may include a plurality of second mold insulating films 112 and a plurality of second gate electrodes WL21 to WL2n and SSL which are alternately stacked on the first mold structure MS1. For example, each of the second gate electrodes WL21 to WL2n and SSL and each second mold insulating film 112 may be a layered structure extending in a direction parallel to the upper side (e.g., the first side 100a) of the first substrate 100. Further, the second gate electrodes WL21 to WL2n and SSL and the second mold insulating film 112 may be alternately stacked along the direction intersecting the upper side of the first substrate 100.

In some embodiments, the plurality of second gate electrodes WL21 to WL2n and SSL may include a plurality of second word lines WL21 to WL2n and a string selection line SSL which are stacked sequentially on the first mold structure MS1.

The first gate electrodes ECL, GSL, and WL11 to WL1n and the second gate electrodes WL21 to WL2n and SSL may each include a conductive material. For example, the first gate electrodes ECL, GSL, and WL11 to WL1n and the second gate electrodes WL21 to WL2n and SSL may include, but are not limited to, metals such as tungsten (W), cobalt (Co), and nickel (Ni), or semiconductor materials such as silicon.

Each of the first mold insulating film 110 and the second mold insulating film 112 may include, for example, but are not limited to, silicon oxides.

The interlayer insulating film 140 may be formed on the first side 100a of the first substrate 100. The interlayer insulating film 140 may cover the mold structures MS1 and MS2.

Each of the plurality of channel structures CH may penetrate the mold structures MS1 and MS2. In some embodiments, the plurality of channel structures CH may extend into the first substrate 100. For example, the plurality of channel structures CH may be buried in the first substrate 100. Also, the channel structures CH may intersect a plurality of gate electrodes ECL, GSL, WL11 to WL1n, WL21 to WL2n, and SSL. In some embodiments, the channel structures CH may extend through the plurality of gate electrodes ECL, GSL, WL11 to WL1n, WL21 to WL2n, and SSL. As an example, the channel structure CH may have a filler shape (e.g., a cylindrical shape) extending in a direction intersecting the first side 100a of the first substrate 100. As used herein, the term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

Although the channel structure CH is shown as being formed only inside the mold structures MS1 and MS2 of the cell array region CELL, this is only for convenience of explanation. For example, in order to reduce the stress applied to the mold structures MS1 and MS2, a dummy channel structure having a shape similar to the channel structure CH may, of course, be formed in the mold structures MS1 and MS2 of the expansion region EXT.

As shown in FIGS. 3a and 3b, the channel structure CH may include a semiconductor pattern 130 and an information storage film 132.

The semiconductor pattern 130 may penetrate the mold structures MS1 and MS2 and intersect a plurality of gate electrodes ECL, GSL, WL11 to WL1n, WL21 to WL2n and SSL. Although the semiconductor pattern 130 is shown as having a cup shape, this is only an example. For example, the semiconductor pattern 130 may have various shapes such as a cylindrical shape, a square barrel shape, and a solid filler shape.

The semiconductor pattern 130 may include, but is not limited to, semiconductor materials such as, for example, single crystal silicon, polycrystalline silicon, organic semiconductor matter, and carbon nanostructure.

The information storage film 132 may be interposed between the semiconductor pattern 130 and the respective gate electrodes ECL, GSL, WL11 to WL1n, WL21 to WL2n, and SSL. For example, the information storage film 132 may extend along the side faces of the semiconductor pattern 130.

The information storage film 132 may include, for example, at least one of silicon oxide, silicon nitride, silicon oxynitride, and high dielectric constant materials having a higher dielectric constant than silicon oxide. The high dielectric constant materials may include, for example, at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, the information storage film 132 may be formed of a multi-film. For example, the information storage film 132 may include a tunnel insulating film 132a, a charge storage film 132b, and a blocking insulating film 132c which are sequentially stacked on the semiconductor pattern 130.

The tunnel insulating film 132a may include, for example, a silicon oxide or a high dielectric constant material (e.g., aluminum oxide ($Al_2O_3$) and hafnium oxide ($HfO_2$)) having a higher dielectric constant than silicon oxide. The charge storage film 132b may include, for example, silicon nitride. The blocking insulating film 132c may include, for example, a silicon oxide or a high dielectric constant material (e.g., aluminum oxide ($Al_2O_3$) and hafnium oxide ($HfO_2$)) having a higher dielectric constant than silicon oxide.

In some embodiments, the channel structure CH may further include a filling pattern 134. The filling pattern 134 may be formed to fill the inside of the cup-shaped semiconductor pattern 130. The filling pattern 134 may include, but is not limited to, insulating materials such as silicon oxides.

As shown in FIG. 3b, the semiconductor memory device according to some embodiments may further include a source structure 300.

The source structure 300 may be formed on the first substrate 100. The source structure 300 may be interposed between the first substrate 100 and the mold structures MS1 and MS2. The source structure 300 may include, for example, impurity-doped polysilicon or metal.

In some embodiments, the channel structure CH may penetrate the source structure 300 and be connected to the first substrate 100. For example, the lower part of the channel structure CH may penetrate the source structure 300 and be buried in the first substrate 100. The source structure 300 may be formed to be connected to the semiconductor pattern 130 of the channel structure CH. For example, the source structure 300 may penetrate the information storage film 132 and contact the semiconductor pattern 130. As used herein, the term "contact" refers to a direction connection (i.e., touching) unless the context indicates otherwise.

In some embodiments, a part of the source structure 300 adjacent to the semiconductor pattern 130 may have a shape protruding toward the information storage film 132. For example, in a region adjacent to the semiconductor pattern 130, a length of the source structure 300 extending in a third direction Z may further increase. For example, a thickness in the third direction Z of a part of the source structure 300 that is horizontally adjacent to the semiconductor pattern 130 may be greater than a thickness in the third direction Z of a part of the source structure 300 that is vertically adjacent to the first substrate 100. This may be due to the property of the etching process for removing a part of the information storage film 132 to form the source structure 300.

The bit line BL may be formed on the mold structures MS1 and MS2. For example, the bit line BL may be formed on the interlayer insulating film 140, and may contact the interlayer insulating film 140. In some embodiments, the bit line BL may be interposed between the mold structures MS1 and MS2 and a second substrate 200 to be described below.

The bit line BL extends in one direction (e.g., a second direction Y of FIG. 1) and may be connected to a plurality of channel structures CH. For example, the bit line BL may be connected to the plurality of channel structures CH through the bit line contact 181. The bit line contact 181 may, for example, penetrate the interlayer insulating film 140 and electrically connect the bit line BL with the channel structure CH.

The block isolation region WLC may extend in a direction intersecting the bit line BL (e.g., the first direction X of FIG. 1) to cut the mold structures MS1 and MS2. Although it is not specifically shown, the block isolation region WLC may be formed inside the cell array region CELL and the extension region EXT to completely cut the mold structures MS1 and MS2.

The block isolation region WLC may cut the mold structures MS1 and MS2 to form a plurality of memory blocks. For example, the mold structures MS1 and MS2 cut by two adjacent block isolation regions WLC may define a single memory block.

In some embodiments, the block isolation region WLC may include an insulating material. For example, the block isolation region WLC may include, but is not limited to, at least one of silicon oxide, silicon nitride, silicon oxynitride, and a low dielectric constant (low-k) material having a lower dielectric constant than silicon oxide.

In some embodiments, the block isolation region WLC may include a conductive material. For example, the block isolation region WLC may include a conductive pattern, and a spacer film that separates the mold structures MS1 and MS2 from the conductive pattern. The block isolation region WLC including the conductive pattern is connected to an impurity region (not shown) in the first substrate 100, and may be provided as a common source line (e.g., CSL of FIG. 1) of the semiconductor memory device.

A gate contact 182 connected to the respective gate electrodes ECL, GSL, WL11 to WL1$n$, WL21 to WL2$n$, and SSL may be formed in the extension region EXT. For example, the gate contact 182 may penetrate the interlayer insulating film 140 and be connected to each of the gate electrodes ECL, GSL, WL11 to WL1$n$, WL21 to WL2$n$, and SSL. In some embodiments, the width of the gate contact 182 may decrease toward the first side 100$a$ of the first substrate 100.

The first through via 184 may penetrate the interlayer insulating film 140. For example, the first through via 184 may extend in a direction intersecting the first side 100$a$ of the first substrate 100 and penetrate the interlayer insulating film 140. In some embodiments, upper and lower surfaces of the first through via 184 and the interlayer insulating film 140 may be coplanar.

In some embodiments, the first through via 184 may be in contact with the interlayer insulating film 140. For example, as shown in FIG. 4, a first through via trench 184$t$ penetrating the interlayer insulating film 140 may be formed. The first through via 184 is formed in the first through via trench 184$t$ and may be in contact with the interlayer insulating film 140.

In some embodiments, the mold structures MS1 and MS2 may not be placed in the region in which the first through via 184 is placed. For example, the first through via 184 may be placed inside the pad region PAD. The first through via 184 may be spaced apart from the mold structures MS1 and MS2 in a direction parallel to the first side 100$a$ of the first substrate 100.

The first through via 184 may include, but is not limited to, for example, metal materials such as aluminum (Al), copper (Cu), tungsten (W), cobalt (Co), and nickel (Ni).

In some embodiments, a second through via 180 connected to the first substrate 100 may be formed. The second through via 180 may, for example, penetrate the interlayer insulating film 140 and be connected to the first substrate 100. The second through via 180 may be connected to an impurity region (not shown) in the first substrate 100 and provided as a common source line (e.g., CSL of FIG. 1) of the semiconductor memory device. The second through via 180 may be connected to a connection wiring 160, which may be formed inside the first inter-wiring insulating film 104. The connection wiring 160 may be connected to the first wiring structure 10 and the second wiring structure 20.

In some embodiments, the mold structures MS1 and MS2 may not be placed in the region in which the second through via 180 is placed. For example, the second through via 180 may be placed inside the pad region PAD. The second through via 180 may be spaced apart from the mold structures MS1 and MS2 in a direction parallel to the first side 100$a$ of the first substrate 100.

The second through via 180 may include, but is not limited to, for example, metal materials such as aluminum (Al), copper (Cu), tungsten (W), cobalt (Co), and nickel (Ni).

In some embodiments, a via 105 may extend through the first substrate 100. Upper and lower surfaces of the via 105 may be coplanar with upper and lower surfaces of the first substrate 100.

The contact via 190 may penetrate the first substrate 100. For example, the contact via 190 extends in a direction intersecting (e.g., perpendicular) to the upper side of the first substrate 100 and may penetrate the first substrate 100. In some embodiments, a first surface of the contact via 190 may be coplanar with the surface of the first side 100$a$ of the first substrate 100, and a second surface of the contact via 190 may be coplanar with a surface of the protective insulating film 102.

In some embodiments, the contact via 190 may be in contact with the first substrate 100. For example, as shown in FIG. 4, a contact via trench 190$t$ that penetrates the first substrate 100 may be formed. The contact via 190 is formed in the contact via trench 190$t$ and may be in contact with the first substrate 100.

In some embodiments, the contact via 190 may include a first spacer film 192 and a first conductive pattern 194. The first spacer film 192 may separate the first conductive pattern 194 from the first substrate 100. For example, the first spacer film 192 may conformally extend along the profile of the side faces of the contact via trench 190$t$. The first conductive pattern 194 may be formed on the first spacer film 192 and fill the contact via trench 190$t$. For example, the first spacer film 192 may surround the side faces of the first conductive pattern 194.

The first spacer film 192 may include an insulating material. Therefore, the first spacer film 192 may electrically insulate the first conductive pattern 194 from the first substrate 100. The first spacer film 192 may include, for example, but is not limited to, at least one of silicon oxide, silicon nitride, silicon oxynitride, and a low dielectric constant (low-k) material having a lower dielectric constant than silicon oxide.

The first conductive pattern 194 may include, but is not limited to, for example, metal materials such as aluminum (Al), copper (Cu), tungsten (W), cobalt (Co), and nickel (Ni).

In some embodiments, the contact via 190 may be connected to the first through via 184. For example, as shown in FIG. 4, the contact via trench 190$t$ may penetrate the first substrate 100 to expose the first through via 184. The first spacer film 192 may not extend along a lower face of the contact via trench 190$t$, and the first conductive pattern 194 may extend along the lower face of the contact via trench 190*t*. Therefore, the first conductive pattern 194 may be in direct contact with the first through via 184, and the contact via 190 may be electrically connected to the first through via 184.

In FIGS. 2*a*, 2*b*, and 4, although an interface between the first through via 184 and the contact via 190 is shown as being placed on the same plane as the first side 100*a* of the first substrate 100, this is only an example. For example, the interface between the first through via 184 and the contact via 190 may, of course, be located to be lower than the first side 100*a* and to be higher than the first side 100*a*.

In some embodiments, the width of the contact via 190 decreases from the second side 100*b* of the first substrate 100 toward the first side 100*a* of the first substrate 100. For example, the width of the contact via trench 190*t* may decrease toward the mold structures MS1 and MS2. The width of the first conductive pattern 194 may also decrease toward the mold structures MS1 and MS2 accordingly.

In some embodiments, the width of the contact via 190 may be formed to be greater than the width of the first through via 184. For example, as shown in FIG. 4, the width W2 of the contact via trench 190*t* may be greater than the width W1 of the first through via trench 184*t*, on the first side 100*a* of the first substrate 100. In such a case, the contact via 190 may be stably connected to the first through via 184.

In some embodiments, a protective insulating film 102 that covers the second side 100*b* of the first substrate 100 may be formed. The contact via 190 penetrates the protective insulating film 102 and the first substrate 100, and may be connected to the first through via 184. For example, the contact via trench 190*t* may penetrate the protective insulating film 102 and the first substrate 100 to expose the first through via 184.

The first semiconductor chip S1 may include an upper input/output pad 30*a*, and the second semiconductor chip S2 may include a lower input/output pad 30*b*.

The upper input/output pad 30*a* and the lower input/output pad 30*b* may be formed on the second side 100*b* of the first substrate 100, respectively. The upper input/output pad 30*a* and the lower input/output pad 30*b* may be connected to the contact via 190, respectively. For example, the upper input/output pad 30*a* may be connected to the contact via 190 of the first semiconductor chip S1, and the lower input/output pad 30*b* may be connected to the contact via 190 of the second semiconductor chip S2. In some embodiments, the upper input/output pad 30*a* may contact the contact via 190 of the first semiconductor chip S1, and the lower input/output pad 30*b* may contact the contact via 190 of the second semiconductor chip S2. The upper input/output pad 30*a* and the lower input/output pad 30*b* may be connected to at least one (e.g., a third circuit element PT3) of the circuit elements PT1 to PT4 to be described later through the contact via 190. In some embodiments, each of the upper input/output pad 30*a* and the lower input/output pad 30*b* may be formed on the protective insulating film 102.

Each of the upper input/output pad 30*a* and the lower input/output pad 30*b* may be used to electrically connect the first semiconductor chip S1 and the second semiconductor chip S2 to a package substrate (e.g., 2100 of FIG. 12) on which the first semiconductor chip S1 and the second semiconductor chip S2 are placed.

As an example, an upper bonding solder 40*a* and an upper bonding wire 50*a* connected to the upper input/output pad 30*a* may be formed. The upper bonding solder 40*a* may be formed on, for example, the protective insulating film 102 of the first semiconductor chip S1 to cover the upper input/ output pad 30*a*. The upper bonding wire 50*a* may extend from, for example, the upper bonding solder 40*a*, and electrically connect the first semiconductor chip S1 to a package substrate or the like on which the first semiconductor chip S1 and the second semiconductor chip S2 are placed.

Further, as an example, a lower bonding solder 40*b* and a lower bonding wire 50*b* connected to the lower input/output pad 30*b* may be formed. The lower bonding solder 40*b* may be formed on, for example, the protective insulating film 102 of the second semiconductor chip S2 to cover the lower input/output pad 30*b*. The lower bonding wire 50*b* may extend from, for example, the lower bonding solder 40*b*, and electrically connect the second semiconductor chip S2 to a package substrate or the like on which the first semiconductor chip S1 and the second semiconductor chip S2 are placed.

The first wiring structure 10 may be formed on the first side 100*a* of the first substrate 100. For example, the first wiring structure 10 may cover the interlayer insulating film 140. The first wiring structure 10 may include a first connection wiring 12 and a first connection via 14. For example, a first inter-wiring insulating film 104 which covers the bit line BL may be formed on the interlayer insulating film 140. The first connection wiring 12 and the first connection via 14 are formed in the first inter-wiring insulating film 104 and may be electrically connected. In some embodiments, at least a part of the first wiring structure 10 may be exposed from the surface of the first inter-wiring insulating film 104.

The second substrate 200 may include, for example, a semiconductor substrate such as a silicon substrate, a germanium substrate or a silicon-germanium substrate. Or, the second substrate 200 may include a silicon-on-insulator (SOI) substrate, a germanium-on-insulator (GOI) substrate, or the like.

The second substrate 200 may face the first side 100*a* of the first substrate 100. For example, the second substrate 200 may include a third side 200*a* facing the first side 100*a*, and a fourth side 200*b* opposite to the third side 200*a*. In some embodiments, the fourth side 200*b* of the second substrate 200 of the first semiconductor chip S1 may face the fourth side 200*b* of the second substrate 200 of the second semiconductor chip S2.

In some embodiments, a plurality of circuit elements PT1 to PT4 may be formed on the third side 200*a* of the second substrate 200. The circuit elements PT1 to PT4 may provide peripheral circuits (for example, a decoder circuit 1110, a page buffer 1120, a logic circuit 1130, or the like of FIG. 11) that control the operation of each memory cell.

Each of the circuit elements PT1 to PT4 may include, for example, but is not limited to, a transistor. For example, each of the circuit elements PT1 to PT4 may include not only various active elements such as transistors, but also various passive elements such as a capacitor, a resistor, and an inductor.

The second wiring structure 20 may be formed on the third side 200*a* of the second substrate 200. For example, the second wiring structure 20 may cover the circuit elements PT1 to PT4. The second wiring structure 20 may include a second connection wiring 22 and a second connection via 24. For example, a second inter-wiring insulating film 204 that covers the circuit elements PT1 to PT4 may be formed on the second substrate 200. The second connection wiring 22 and the second connection via 24 are formed in the second inter-wiring insulating film 204, and may be electrically connected. In some embodiments, at least a part of the second wiring structure 20 may be exposed from the surface of the second inter-wiring insulating film 204.

In some embodiments, the first inter-wiring insulating film 104 may be attached to the second inter-wiring insulating film 204. By attaching the first inter-wiring insulating film 104 and the second inter-wiring insulating film 204, the first wiring structure 10 and the second wiring structure 20 may be electrically connected to each other. For example, the first connection wiring 12 exposed from the first inter-wiring insulating film 104 may come into contact with the second connection wiring 22 exposed from the second inter-wiring insulating film 204. The first connection wiring 12 and the second connection wiring 22 may be electrically connected by a copper-copper bonding (Cu to Cu bonding) process, but embodiments are not limited thereto. For example, the first connection wiring 12 and the second connection wiring 22 may, of course, include other metal materials such as aluminum (Al) or tungsten (W), respectively.

In some embodiments, the bit line BL may be connected to a first circuit element PT1 on the second substrate 200. For example, the bit line BL may be connected to the first circuit element PT1 through the first wiring structure 10 and the second wiring structure 20. The first circuit element PT1 may provide, for example, a page buffer (e.g., page buffer 1120 of FIG. 11).

In some embodiments, the gate electrodes ECL, GSL, WL11 to WL1n, WL21 to WL2n, and SSL may be connected to the second circuit element PT2 on the second substrate 200. For example, a third connection wiring 162 connected to the gate contact 182 may be formed inside the first inter-wiring insulating film 104. The third connection wiring 162 may be connected to the second circuit element PT2 through the first wiring structure 10 and the second wiring structure 20. The second circuit element PT2 may provide, for example, a decoder circuit (e.g., decoder circuit 1110 of FIG. 11).

In some embodiments, the first through via 184 may be connected to a third circuit element PT3 on the second substrate 200. For example, a fourth connection wiring 164 may be formed inside the first inter-wiring insulating film 104. The fourth connection wiring 164 may be connected to the third circuit element PT3 through the first wiring structure 10 and the second wiring structure 20. Accordingly, the upper input/output pad 30a may be connected to the third circuit element PT3 of the first semiconductor chip S1, and the lower input/output pad 30b may be connected to the third circuit element PT3 of the second semiconductor chip S2. The third circuit element PT3 may provide, for example, a logic circuit (e.g., logic circuit 1130 of FIG. 11).

The substrate attachment film 202 may be interposed between the first semiconductor chip S1 and the second semiconductor chip S2 to attach the first semiconductor chip S1 and the second semiconductor chip S2 to each other. The substrate attachment film 202 may be formed on the fourth side 200b of the second substrate 200 to attach the first peri structure PE1 and the second peri structure PE2. As an example, the substrate attachment film 202 may attach the second substrate 200 of the first semiconductor chip S1 and the second substrate 200 of the second semiconductor chip S2.

Accordingly, the semiconductor memory device according to some embodiments may include an upper input/output pad 30a and a lower input/output pad 30b that are placed on the faces opposite to each other. For example, as shown in FIG. 2a, the upper input/output pad 30a may be placed above the semiconductor memory device according to some embodiments, and the lower input/output pad 30b may be placed below the semiconductor memory device according to some embodiments.

Further, as described above, the upper input/output pads 30a and the lower input/output pads 30b placed on the faces opposite to each other may be used to electrically connect the first semiconductor chip S1 and the second semiconductor chip S2 to a package substrate (e.g., 2100 of FIG. 12) on which the first semiconductor chip S1 and the second semiconductor chip S2 are placed. Accordingly, a semiconductor memory device that is freely connected to a package substrate and is easy to design may be provided.

In some embodiments, the substrate attachment film 202 may include a first attachment film 202a and a second attachment film 202b. The first attachment film 202a may cover the fourth side 200b of the second substrate 200 of the first semiconductor chip S1. The second attachment film 202b may cover the fourth side 200b of the second substrate 200 of the second semiconductor chip S2. The first attachment film 202a may be attached to the second attachment film 202b. By attaching the first attachment film 202a and the second attachment film 202b, the substrate attachment film 202 may attach the first semiconductor chip S1 and the second semiconductor chip S2.

Although an interface AS to which the first attachment film 202a and the second attachment film 202b are attached is shown, this is only an example. It is a matter of course that the interface AS may not exist due to the attachment of the first attachment film 202a to the second attachment film 202b.

The first attachment film 202a and the second attachment film 202b may be attached by, for example, an oxide-to-oxide bonding process. For example, the first attachment film 202a and the second attachment film 202b may each include a silicon oxide. However, this is only an example, and as long as the first attachment film 202a is attached to the second attachment film 202b, the material that forms the first attachment film 202a and the second attachment film 202b is not limited. For example, the first attachment film 202a and the second attachment film 202b may also include at least one of silicon nitride, silicon oxynitride, silicon oxycarbonitride, and combinations thereof.

Figure 5:
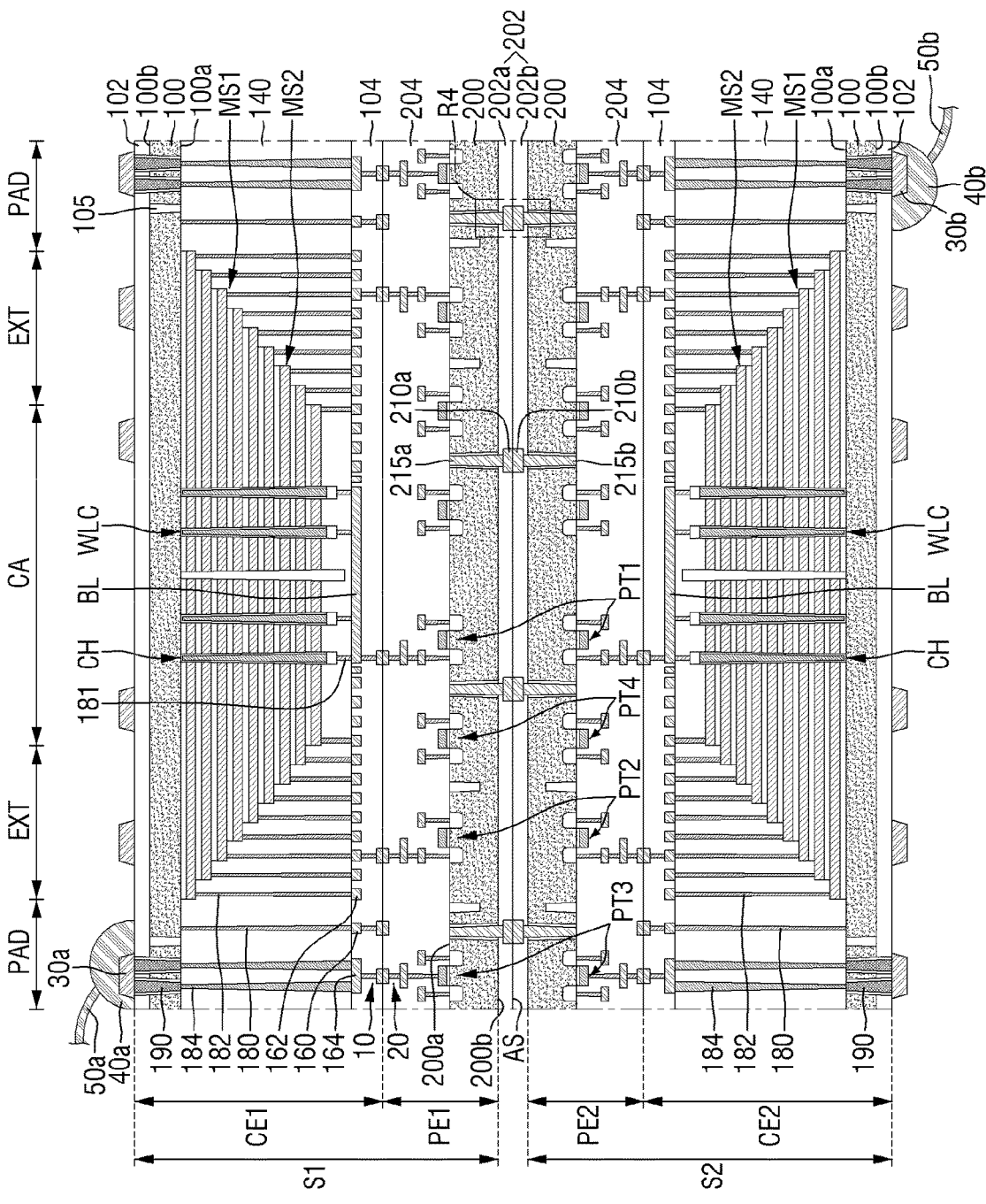
FIG. 5 is a schematic cross-sectional view for explaining a semiconductor memory device, according to some embodiments.
Figure 6:
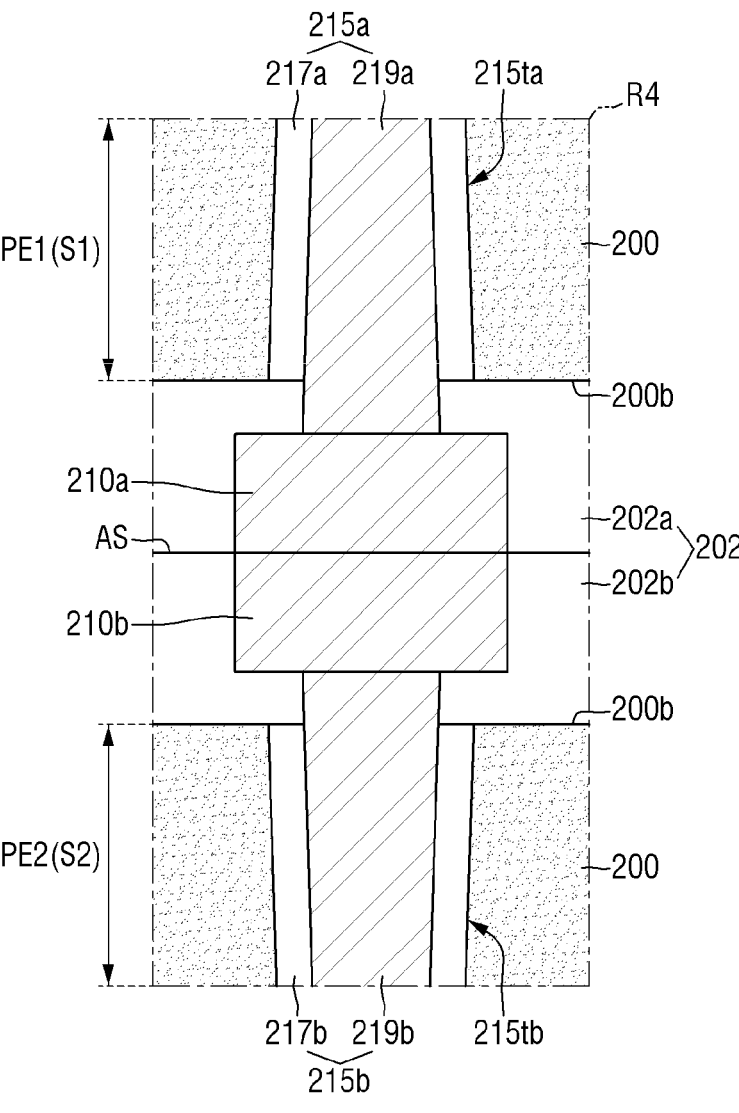
FIG. 6 is an enlarged view for explaining a region R4 of FIG. 5.

FIG. 5 is a schematic cross-sectional view for explaining a semiconductor memory device according to some embodiments. FIG. 6 is an enlarged view for explaining a region R4 of FIG. 5. For convenience of explanation, repeated parts of those mentioned above using FIGS. 1 to 4 will be briefly explained or omitted.

Referring to FIGS. 5 and 6, in the semiconductor memory device according to some embodiments, the substrate attachment film 202 may further include a first attachment pad 210a and a second attachment pad 210b.

The first attachment pad 210a may be placed inside the first attachment film 202a. The first attachment pad 210a may be exposed from the surface of the first attachment film 202a. For example, as shown, the first attachment pad 210a may be exposed from the lower face of the first attachment film 202a. A lower surface of the first attachment pad 210a may be coplanar with a surface of the lower face of the first attachment film 202a.

The second attachment pad 210b may be placed inside the second attachment film 202b. The second attachment pad 210b may be exposed from the surface of the second attachment film 202b. For example, as shown, the second attachment pad 210b may be exposed from the upper face of the second attachment film 202b. An upper surface of the second attachment pad 210*b* may be coplanar with a surface of the upper face of the second attachment film 202*b*.

By attaching the first attachment film 202*a* to the second attachment film 202*b*, the first attachment pad 210*a* may be attached to the second attachment pad 210*b*. The first attachment pad 210*a* and the second attachment pad 210*b* may be attached by, for example, a copper-copper bonding (Cu to Cu bonding) process. For example, the first attached pad 210*a* and the second attachment pad 210*b* may each include copper (Cu). However, this is only an example, and the first attachment pad 210*a* and the second attachment pad 210*b* may, of course, include other metal materials such as aluminum (Al) or tungsten (W), respectively.

In some embodiments, a third connection via 215*a* connected to the first attachment pad 210*a* and a fourth connection via 215*b* connected to the second attachment pad 210*b* may be formed.

The third connection via 215*a* may penetrate the second substrate 200 of the first semiconductor chip S1. For example, as shown in FIG. 6, a first connection via trench 215*ta* that penetrates the second substrate 200 of the first semiconductor chip S1 may be formed. The third connection via 215*a* may fill the first connection via trench 215*ta*. In some embodiments, the third connection via 215*a* may penetrate the first attachment film 202*a* and be connected to the first attachment pad 210*a*. For example, the third connection via 215*a* may contact the first attachment film 202*a*.

In some embodiments, the third connection via 215*a* may include a second spacer film 217*a* and a second conductive pattern 219*a*. The second spacer film 217*a* may separate the second conductive pattern 219*a* from the second substrate 200 of the first semiconductor chip S1. For example, the second spacer film 217*a* may conformally extend along the profile of the side face of the first connection via trench 215*ta*. The second conductive pattern 219*a* may be formed on the second spacer film 217*a* and fill the first connection via trench 215*ta*.

The fourth connection via 215*b* may penetrate the second substrate 200 of the second semiconductor chip S2. For example, as shown in FIG. 6, a second connection via trench 215*tb* that penetrates the second substrate 200 of the second semiconductor chip S2 may be formed. The fourth connection via 215*b* may fill the second connection via trench 215*tb*. In some embodiments, the fourth connection via 215*b* may penetrate the second attachment film 202*b* and be connected to the second attachment pad 210*b*. For example, the fourth connection via 215*b* may contact the second attachment film 202*b*.

In some embodiments, the fourth connection via 215*b* may include a third spacer film 217*b* and a third conductive pattern 219*b*. The third spacer film 217*b* may separate the third conductive pattern 219*b* from the second substrate 200 of the second semiconductor chip S2. For example, the third spacer film 217*b* may conformally extend along the profile of the side face of the second connection via trench 215*tb*. The third conductive pattern 219*b* may be formed on the third spacer film 217*b* and fill the first connection via trench 215*ta*.

Since the first attachment pad 210*a* may be attached to the second attachment pad 210*b*, the third connection via 215*a* and the fourth connection via 215*b* may be electrically connected. Therefore, in some embodiments, the first semiconductor chip S1 and the second semiconductor chip S2 may be electrically connected to each other.

Figure 7:
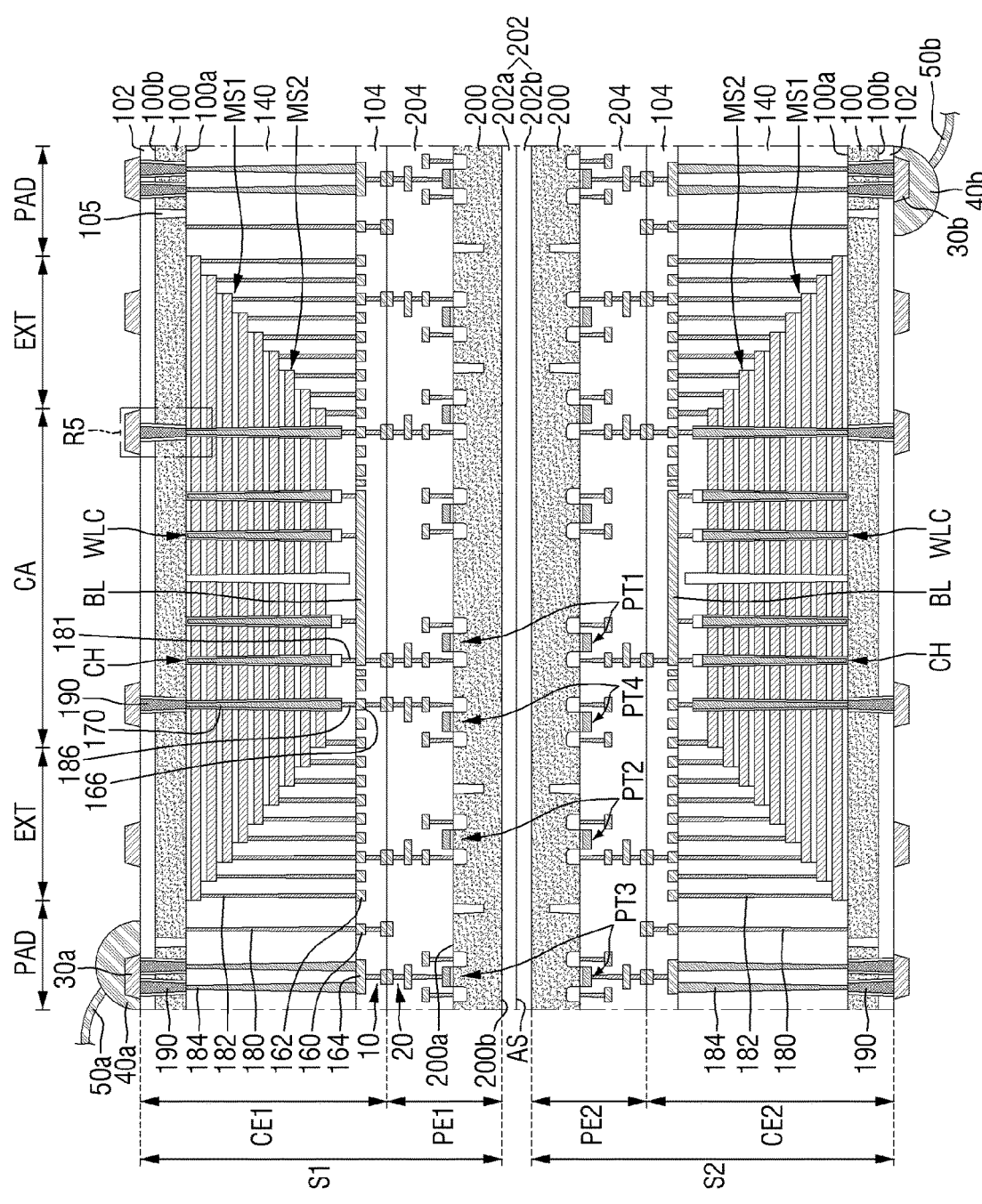
FIG. 7 is a schematic cross-sectional view for explaining a semiconductor memory device, according to some embodiments.
Figure 8:
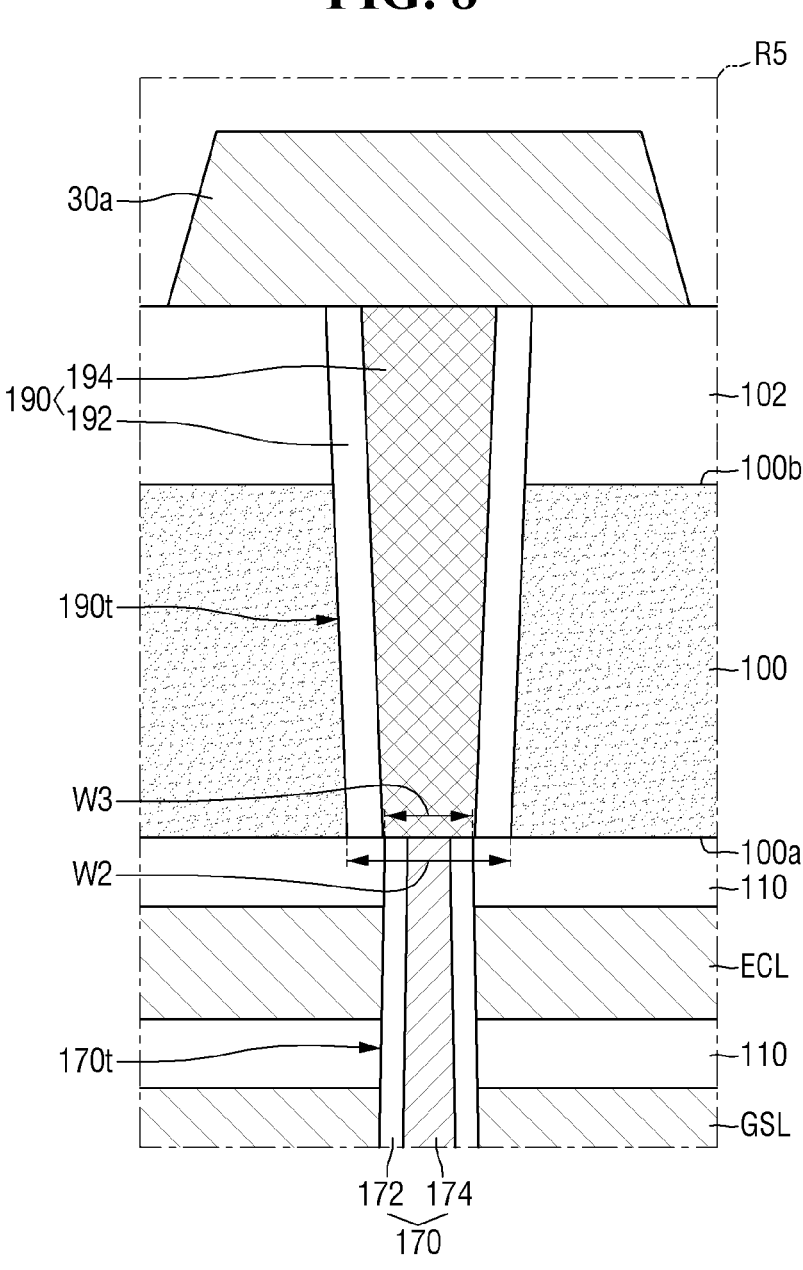
FIG. 8 is an enlarged view for explaining a region R5 of FIG. 7.

FIG. 7 is a schematic cross-sectional view for explaining a semiconductor memory device according to some embodiments. FIG. 8 is an enlarged view for explaining a region R5 of FIG. 7. For convenience of explanation, repeated parts of contents explained above using FIGS. 1 to 4 will be briefly explained or omitted.

Referring to FIGS. 7 and 8, in the semiconductor memory device according to some embodiments, each of the first semiconductor chip S1 and the second semiconductor chip S2 may further include a third through via 170.

The third through via 170 may penetrate the mold structures MS1 and MS2 and be connected to the contact via 190. For example, as shown in FIG. 8, a second through via trench 170*t* that extends in a direction intersecting the first side 100*a* of the first substrate 100 and penetrates the mold structures MS1 and MS2 may be formed. The third through via 170 may be formed inside the second through via trench 170*t*.

In some embodiments, the third through via 170 may include a fourth spacer film 172 and a fourth conductive pattern 174. The fourth spacer film 172 may separate the fourth conductive pattern 174 from the mold structures MS1 and MS2. For example, the fourth spacer film 172 may conformally extend along the profile of side faces of each second through via trench 170*t*. The fourth conductive pattern 174 is formed on the fourth spacer film 172 and may fill each second through via trench 170*t*. For example, the fourth spacer film 172 may surround the side face of the fourth conductive pattern 174.

The fourth spacer film 172 may include an insulating material. This allows the fourth spacer film 172 to electrically insulate the fourth conductive pattern 174 from the mold structures MS1 and MS2. The fourth spacer film 172 may include, for example, but not limited to, at least one of silicon oxide, silicon nitride, silicon oxynitride, and a dielectric constant (low-k) material having a lower dielectric constant than silicon oxide.

The fourth conductive pattern 174 may include metal materials such as aluminum (Al), copper (Cu), tungsten (W), cobalt (Co), and nickel (Ni), respectively.

In some embodiments, the width of the third through via 170 may decrease toward the first substrate 100. For example, the width of the second through via trench 170*t* may each decrease toward the first substrate 100. Thus, the width of the fourth conductive pattern 174 may also decrease toward the first substrate 100.

In some embodiments, the contact via 190 may be connected to the third through via 170. For example, as shown in FIG. 8, the contact via trench 190*t* may penetrate the first substrate 100 and expose the third through via 170. Accordingly, the first conductive pattern 194 may be in direct contact with the fourth conductive pattern 174, and the contact via 190 may be electrically connected to the third through via 170.

Although FIGS. 7 and 8 show that the interface between the third through via 170 and the contact via 190 is placed on the same plane as the first side 100*a* of the first substrate 100, this is only an example. For example, the interface between the third through via 170 and the contact via 190 may, of course, be placed to be lower than the first side 100*a* and may be placed to be higher than the first side 100*a*.

In some embodiments, the width of the contact via 190 may be formed to be greater than the width of the third through via 170. For example, as shown in FIG. 8, a width W2 of the contact via trench 190*t* may be greater than a width W3 of the second through via trench 170*t*, on the first side 100*a* of the first substrate 100. In such cases, the contact via 190 may be stably connected to the third through via 170.

In some embodiments, the third through via 170 may be connected to a fourth circuit element PT4 on the second substrate 200. The third through via 170 may be connected to contact 186. The contact 186 may be formed inside the interlayer insulating film 140. The contact 186 may be connected to a fifth connection wiring 166. For example, the fifth connection wiring 166 may be formed inside the first inter-wiring insulating film 104. The fifth connection wiring 166 may be connected to the fourth circuit element PT4 through the first wiring structure 10 and the second wiring structure 20. Accordingly, the upper input/output pad 30*a* may be connected to the fourth circuit element PT4 of the first semiconductor chip S1, and the lower input/output pad 30*b* may be connected to the fourth circuit element PT4 of the second semiconductor chip S2. The fourth circuit element PT4 may provide, for example, a logic circuit (e.g., logic circuit 1130 of FIG. 11).

Figure 9:
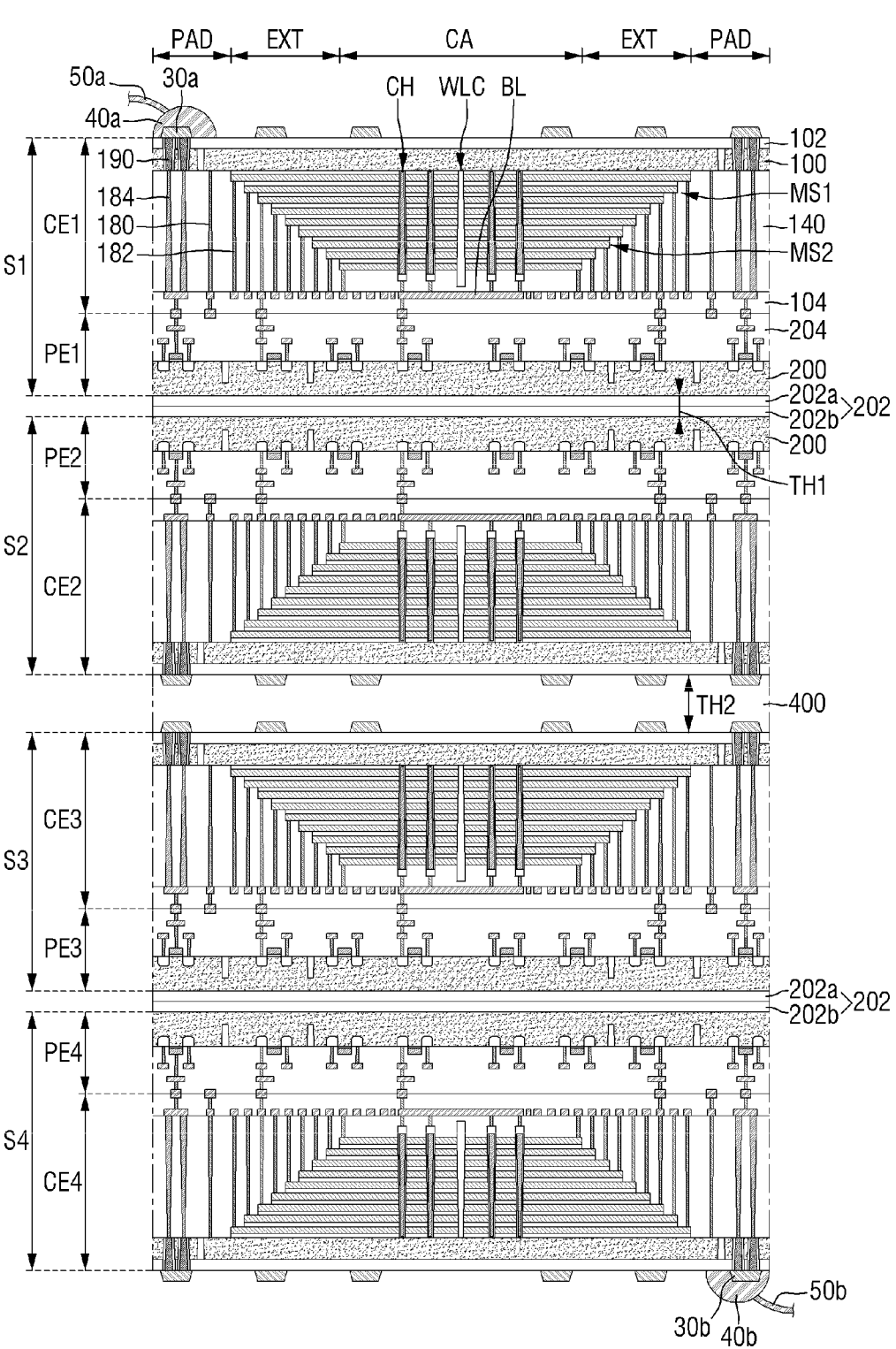
FIG. 9 is a schematic cross-sectional view for explaining a semiconductor memory device, according to some embodiments.

FIG. 9 is a schematic cross-sectional view for explaining a semiconductor memory device according to some embodiments. For convenience of explanation, repeated parts of contents explained above using FIGS. 1 to 8 will be briefly explained or omitted.

Referring to FIG. 9, the semiconductor memory device according to some embodiments may include first to fourth semiconductor chips S1, S2, S3, and S4, a substrate attachment film 202, and a chip attachment film 400. The third and fourth semiconductor chips S3 and S4 may be substantially the same as or identical to the first and second semiconductor chips S1 and S2.

A third semiconductor chip S3 may include a third cell structure CE3 and a third peri structure PE3. A fourth semiconductor chip S4 may include a fourth cell structure CE4 and a fourth peri structure PE4.

The third cell structure CE3 and the fourth cell structure CE4 may each provide a memory cell array including at least one memory block. For example, the third cell structure CE3 and the fourth cell structure CE4 may include the first substrate 100, the mold structures MS1 and MS2, the interlayer insulating film 140, the plurality of channel structures CH, the bit line BL, the block isolation region WLC, the first through via 184, the contact via 190, and the first wiring structure 10 mentioned above.

The third peri structure PE3 and the fourth peri structure PE4 may each provide a peripheral circuit that controls the operation of the memory cell array of the third cell structure CE3 and the fourth cell structure CE4, respectively. For example, each of the third peri structure PE3 and the fourth peri structure PE4 may include the second substrate 200, the plurality of circuit elements PT1 to PT4, and the second wiring structure 20 mentioned above.

In some embodiments, the third semiconductor chip S3 and the fourth semiconductor chip S4 may be substantially the same semiconductor chips. For example, the third semiconductor chip S3 and the fourth semiconductor chip S4 may be semiconductor chips manufactured by the same fabricating process.

In some embodiments, the substrate attachment film 202 may be interposed between the third semiconductor chip S3 and the fourth semiconductor chip S4 and attach the third semiconductor chip S3 and the fourth semiconductor chip S4 to each other. The substrate attachment film 202 may be formed on the fourth side 200*b* of the second substrate 200 and attach the third peri structure PE3 and the fourth peri structure PE4 to each other. As an example, the substrate attachment film 202 may attach the second substrate 200 of the third semiconductor chip S3 to the second substrate 200 of the fourth semiconductor chip S4.

The chip attachment film 400 may attach the first to fourth semiconductor chips S1, S2, S3, and S4 to each other in the region in which the substrate attachment film 202 is not formed. For example, as shown, the chip attachment film 400 may be interposed between the second semiconductor chip S2 and the third semiconductor chip S3 and attach the second semiconductor chip S2 and the third semiconductor chip S3.

In some embodiments, the chip attachment film 400 may be formed on the second side 100*b* of the first substrate 100 to attach the second cell structure CE2 and the third cell structure CE3. As an example, the chip attachment film 400 may attach the protective insulating film 102 of the second semiconductor chip S2 and the protective insulating film 102 of the third semiconductor chip S3.

The chip attachment film 400 may be a die attach film (DAF), a wafer tape, or a stacked form thereof. However, this is only an example, and as long as the first to fourth semiconductor chips S1, S2, S3, and S4 are attached to each other, the materials that make up the chip attachment film 400 are not limited.

In some embodiments, a thickness TH1 of the substrate attachment film 202 may be smaller than a thickness TH2 of the chip attachment film 400. As an example, a thickness TH2 of the chip attachment film 400 may be about 10 μm to about 30 μm, and the thickness TH1 of the substrate attachment film 202 may be about 1 μm to about 10 μm.

In response to the demand for miniaturization of semiconductor packages, methods capable of reducing the thickness of the stacked semiconductor chips are being studied. However, if the chip attachment film 400 (for example, a die attach film (DAF)) is used for each semiconductor chip to attach the semiconductor chips, there is a limit to reduction of the thickness of the stacked semiconductor chips due to the thickness of the relatively thick die attach film. Also, this induces a warpage of the semiconductor package, which becomes a cause of reducing the reliability of the semiconductor package.

In contrast, the semiconductor memory device according to some embodiments may reduce the use of the chip attachment film 400, by including the substrate attachment film 202 of a relatively thin thickness. Specifically, as mentioned above, the substrate attachment film 202 may be interposed between some semiconductor chips (e.g., the first semiconductor chip S1 and the second semiconductor chip S2) among the stacked semiconductor chips to replace the substrate attachment film 202. As an example, since the substrate attachment film 202 may be formed by an oxide-to-oxide bonding process, it may be formed with a thickness relatively thinner than that of the chip attachment film 400. Accordingly, the thickness of the stacked semiconductor chips may be reduced, and a semiconductor memory device in which a warpage is prevented and reliability is improved may be provided.

Figure 10:
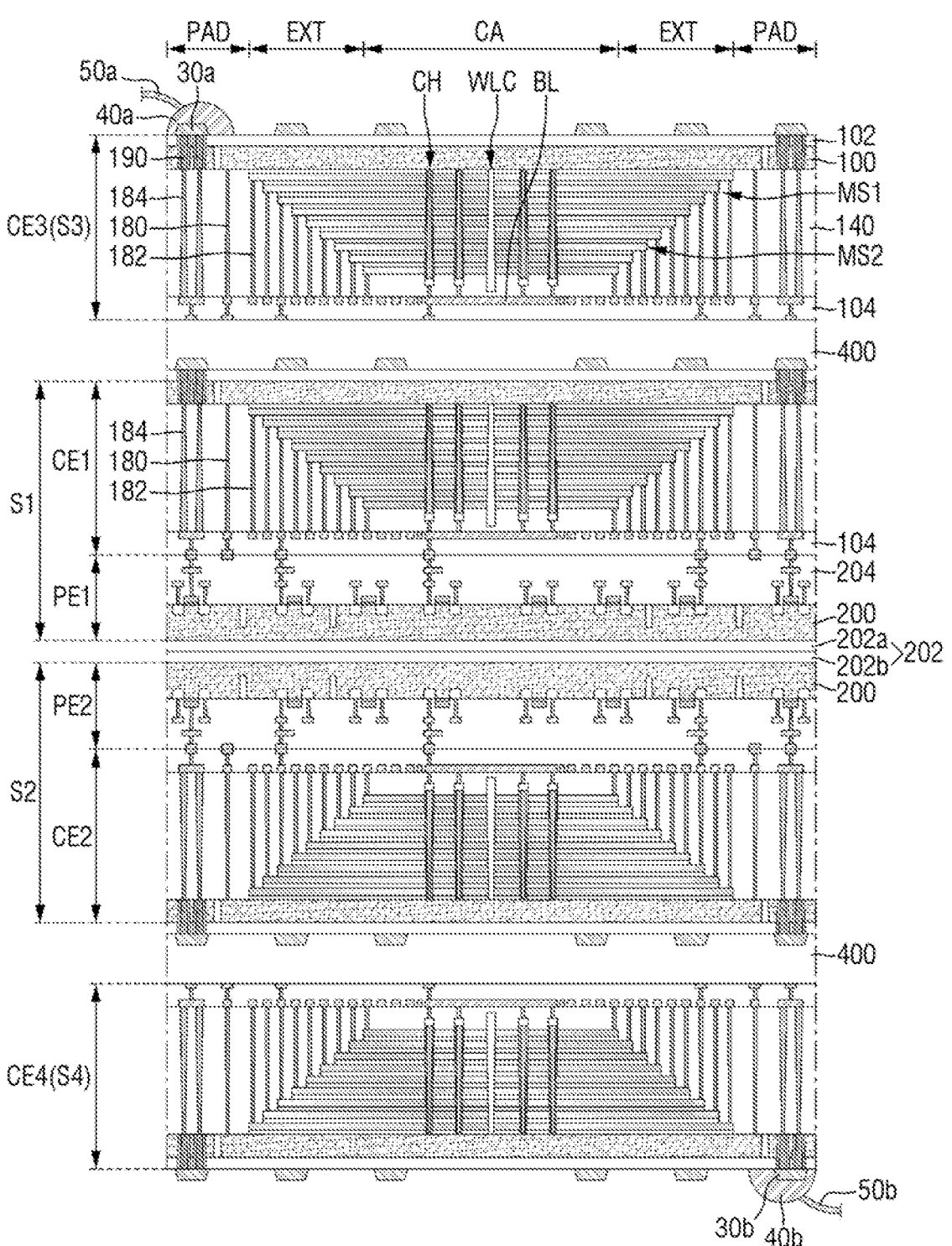
FIG. 10 is a schematic cross-sectional view for explaining a semiconductor memory device, according to some embodiments.

FIG. 10 is a schematic cross-sectional view for explaining a semiconductor memory device according to some embodiments. For convenience of explanation, repeated parts of contents explained above using FIGS. 1 to 9 will be briefly explained or omitted.

Referring to FIG. 10, in the semiconductor memory device according to some embodiments, the third semiconductor chip S3 and the fourth semiconductor chip S4 may be attached to the first semiconductor chip S1 or the second semiconductor chip S2 by the chip attachment film 400.

As an example, the chip attachment film 400 may be interposed between the first semiconductor chip S1 and the third semiconductor chip S3 to attach the first semiconductor chip S1 and the third semiconductor chip S3. Further, the chip attachment film 400 may be interposed between the second semiconductor chip S2 and the fourth semiconductor chip S4 to attach the second semiconductor chip S2 and the fourth semiconductor chip S4.

In some embodiments, the third semiconductor chip S3 may not include a peri structure. For example, the third semiconductor chip S3 may include a third cell structure CE3 and may not include a third pen structure (e.g., third pen structure PE3 of FIG. 9). In some embodiments, the third semiconductor chip S3 is attached to the first semiconductor chip S1 and may share the first pen structure PE1. For example, the third cell structure CE3 may be electrically connected to the first pen structure PE1 through a connecting structure (not shown) such as a bonding wire.

In some embodiments, the fourth semiconductor chip S4 may not include a peri structure. For example, the fourth semiconductor chip S4 may include the fourth cell structure CE4 and may not include the fourth pen structure (e.g., fourth pen structure PE4 of FIG. 9). In some embodiments, the fourth semiconductor chip S4 may be connected to the second semiconductor chip S2 and share the second peri structure PE2. For example, the fourth cell structure CE4 may be electrically connected to the second pen structure PE2 through a connecting structure (not shown) such as a bonding wire.

In some embodiments, the first side 100a of the first substrate 100 of the third semiconductor chip S3 may face the chip attachment film 400. For example, the chip attachment film 400 is formed on the first inter-wiring insulating film 104 of the third semiconductor chip S3, and may attach the first cell structure CE1 and the third cell structure CE3. As an example, the chip attachment film 400 may attach the protective insulating film 102 of the first semiconductor chip S1 and the first inter-wiring insulating film 104 of the third semiconductor chip S3.

In some embodiments, the first side 100a of the first substrate 100 of the fourth semiconductor chip S4 may face the chip attachment film 400. For example, the chip attachment film 400 is formed on the first inter-wiring insulating film 104 of the fourth semiconductor chip S4, and may attach the first cell structure CE1 and the third cell structure CE3. As an example, chip attachment film 400 may attach the protective insulating film 102 of the first semiconductor chip S1 and the first inter-wiring insulating film 104 of the third semiconductor chip S3.

Hereinafter, an electronic system including a semiconductor memory device according to the exemplary embodiments will be explained referring to FIGS. 1 to 17.

Figure 11:
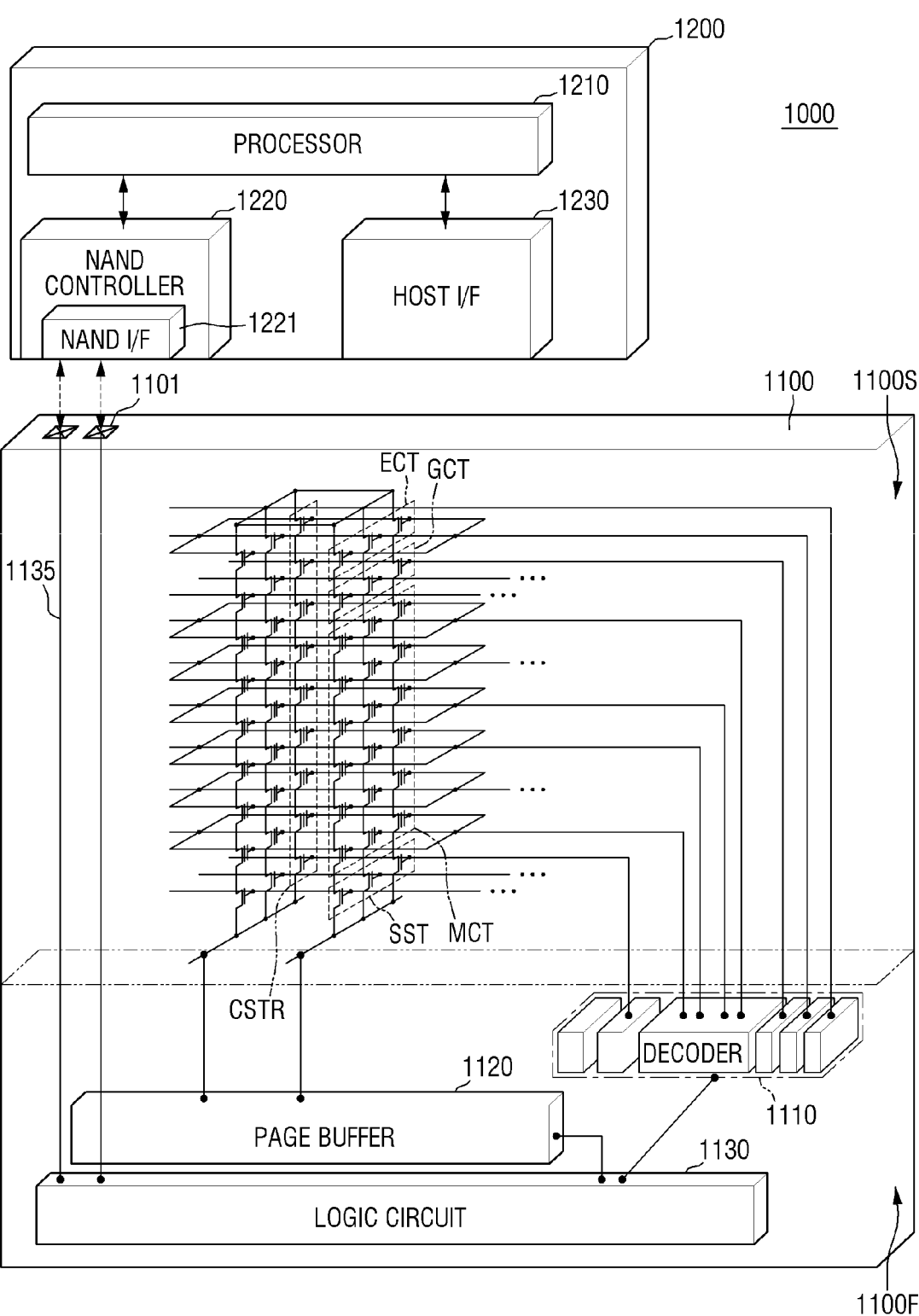
FIG. 11 is a schematic block diagram for explaining an electronic system, according to some embodiments.
Figure 12:
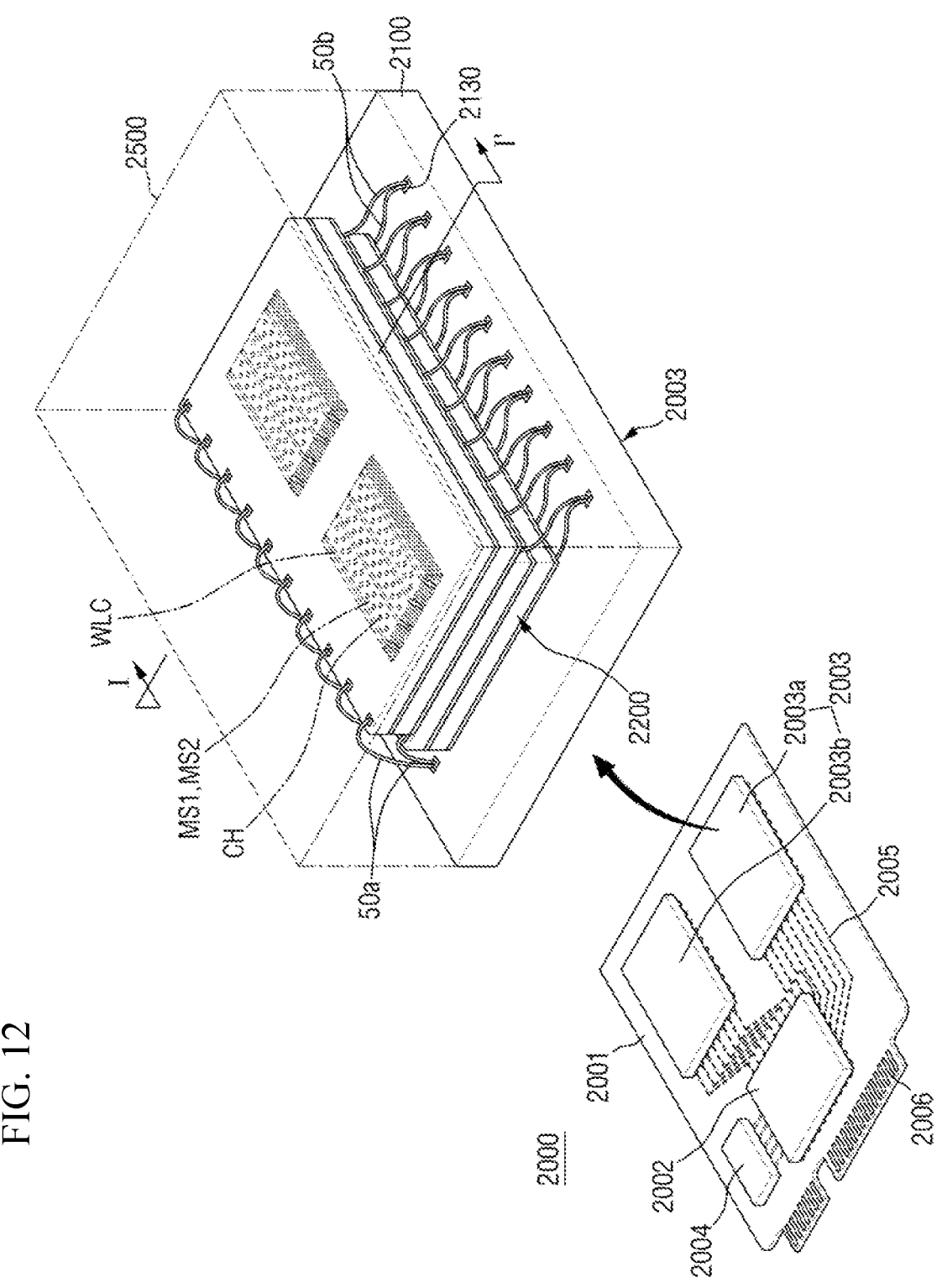
FIG. 12 is a schematic perspective view for explaining the electronic system, according to some embodiments.

FIG. 11 is a schematic block diagram for explaining an electronic system according to some embodiments. FIG. 12 is a schematic perspective view for explaining the electronic system according to some embodiments. FIGS. 13 to 17 are various schematic cross-sectional views taken along a line I-I' of FIG. 12. For convenience of explanation, repeated parts of contents explained above using FIGS. 1 to 10 will be briefly explained or omitted.

Referring to FIG. 11, an electronic system 1000 according to some embodiments may include a semiconductor memory device 1100, and a controller 1200 that is electrically connected to the semiconductor memory device 1100. The electronic system 1000 may be a storage device including a single or a plurality of semiconductor memory devices 1100, or an electronic device including the storage device. For example, the electronic system 1000 may be an SSD device (solid state drive device) including a single or a plurality of semiconductor memory devices 1100, a USB (Universal Serial Bus), a computing system, a medical device, or a communication device.

The semiconductor memory device 1100 may be a non-volatile memory device (for example, a NAND flash memory device), and may be, for example, the semiconductor memory devices mentioned above using FIGS. 1 to 10. The semiconductor memory device 1100 may include a decoder circuit 1110, a page buffer 1120, and a logic circuit 1130.

The semiconductor memory device 1100 may communicate with the controller 1200 through an input/output pad 1101 that is electrically connected to the logic circuit 1130. The input/output pad 1101 may be electrically connected to the logic circuit 1130 through an input/output connection wiring 1135 extending from the inside of the first structure 1100F to the second structure 1100S. The input/output pad 1101 may be, for example, at least one of the upper input/output pad 30a and the lower input/output pad 30b explained above using FIGS. 1 to 10. The input/output connection wiring 1135 may be, for example, the first through via 184 or the contact via 190 mentioned above using FIGS. 1 to 10.

The controller 1200 may include a processor 1210, a NAND controller 1220, and a host interface 1230. In some embodiments, the electronic system 1000 may include a plurality of semiconductor memory devices 1100, and in this case, the controller 1200 may control the plurality of semiconductor memory devices 1100.

The processor 1210 may control the operation of the overall electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes communication with the semiconductor memory device 1100. A control command for controlling the semiconductor memory device 1100, data to be recorded in the memory cell transistors MCT of the semiconductor memory device 1100, and data to be read from the memory cell transistors MCT of the semiconductor memory device 1100 may be transmitted through the NAND interface 1221. The host interface 1230 may provide a communication function between the electronic system 1000 and an external host. Upon receiving the control command from an external host through the host interface 1230, the processor 1210 may control the semiconductor memory device 1100 in response to the control command.

Referring to FIG. 12, an electronic system 2000 according to some embodiments may include a main board 2001, a main controller 2002 mounted on the main board 2001, one or more semiconductor packages 2003, and a DRAM 2004. The semiconductor package 2003 and the DRAM 2004 may be connected to the main controller 2002 by wiring patterns 2005 formed on the main board 2001.

The main board 2001 may include a connector 2006 including a plurality of fins coupled to an external host. The number and arrangement of the plurality of fins in the connector 2006 may vary depending on the communication interface between the electronic system 2000 and the external host. In some embodiments, the electronic system 2000 may communicate with an external host according to any one of the interfaces such as M-Phy for a USB (Universal Serial Bus), a PCI-Express (Peripheral Component Interconnect Express), a SATA (Serial Advanced Technology Attachment), and a UFS (Universal Flash Storage). In some embodiments, the electronic system 2000 may operate by power supplied from an external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

A DRAM 2004 may be a buffer memory for alleviating a speed difference between the semiconductor package 2003, which is a data storage space, and the external host. The DRAM 2004 included in the electronic system 2000 may also operate as a kind of cache memory, and may also provide a space for temporarily storing data in the control operation of the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages including a plurality of semiconductor chips 2200, respectively. Each of the first and second semiconductor packages 2003a and 2003b may include a package substrate 2100, semiconductor chips 2200 on the package substrate 2100, bonding wires 50a and 50b that electrically connect the semiconductor chips 2200 and the package substrate 2100, and a molding layer 2500 that covers the semiconductor chips 2200 and the bonding wires 50a and 50b on the package substrate 2100.

The package substrate 2100 may be a printed circuit board including package upper pads 2130. Each of the semiconductor chips 2200 may include the mold structures MS1 and MS2 and the channel structures CH mentioned above using FIGS. 1 to 10. For example, the semiconductor chips 2200 may be, for example, the first semiconductor chip S1 or the second semiconductor chip S2 mentioned above using FIGS. 1 to 10.

In some embodiments, the bonding wires 50a and 50b may be bonding wires that electrically connect the semiconductor chips 2200 to the package upper pads 2130. Therefore, in each of the first and second semiconductor packages 2003a and 2003b, the semiconductor chips 2200 may be electrically connected to each other in the bonding wire manner, and may be electrically connected to the package upper pads 2130 of the package substrate 2100.

In some embodiments, the main controller 2002 and the semiconductor chips 2200 may be included in a single package. In some embodiments, the main controller 2002 and the semiconductor chips 2200 are mounted on a separate interposer board different from the main board 2001, and the main controller 2002 and the semiconductor chips 2200 may also be connected to each other by the wiring formed on the interposer board.

Figure 13:
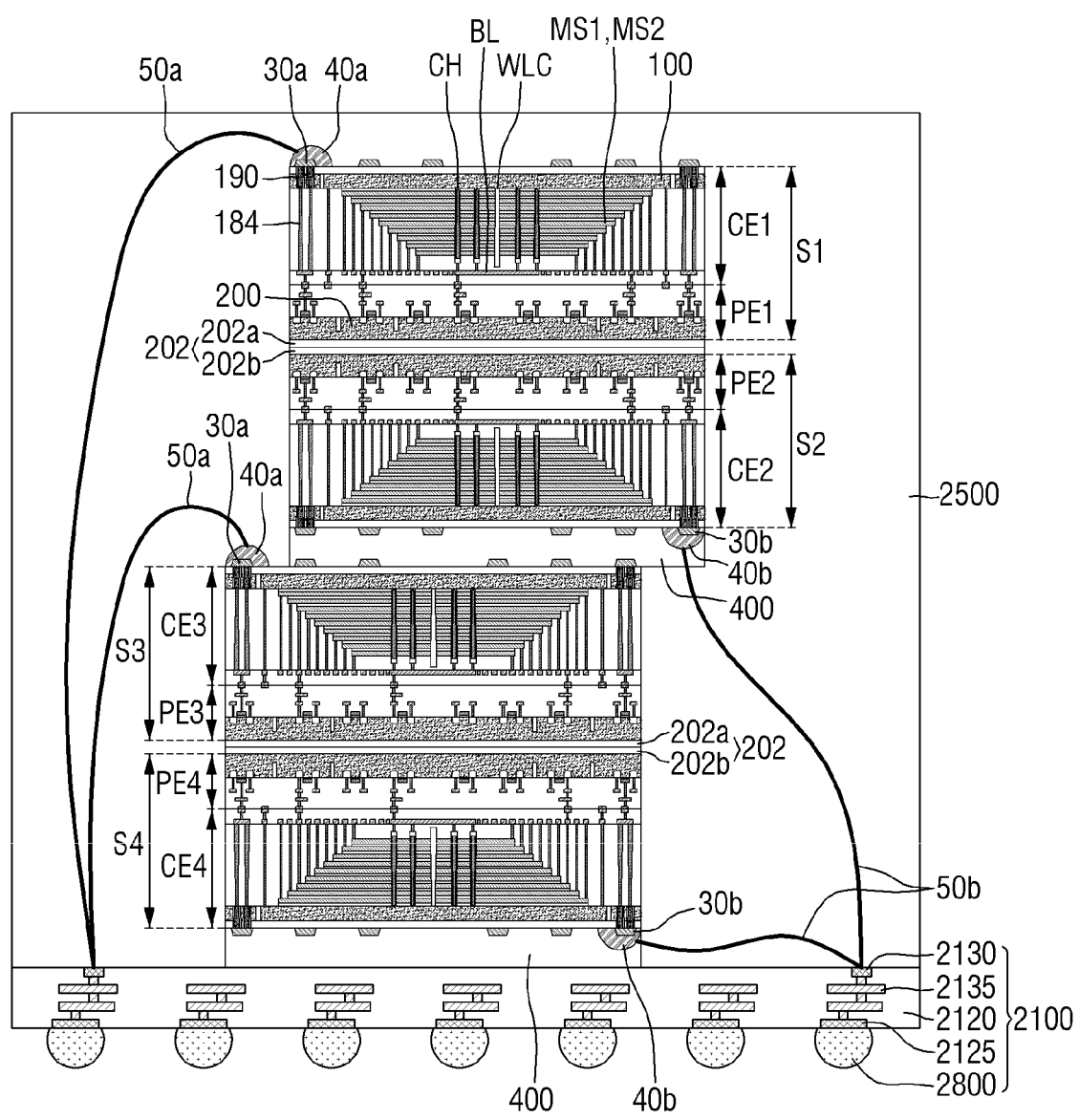
FIGS. 13 to 17 are various schematic cross-sectional views taken along a line I-I' of FIG. 12.

Referring to FIGS. 12 and 13, in the semiconductor package 2003, the package substrate 2100 may be a printed circuit board. The package substrate 2100 may include a package substrate body portion 2120, package upper pads 2130 placed on the upper face of the package substrate body portion 2120, lower pads 2125 placed on the lower face of the package substrate body portion 2120 or exposed through the lower face, and internal wirings 2135 that electrically connect the package upper pads 2130 and lower pads 2125 inside the package substrate body portion 2120. The package upper pads 2130 may be electrically connected to the bonding wires 50a and 50b. The lower pads 2125 may be connected to the wiring patterns 2005 of the main board

2010 of the electronic system 2000 through conductive connections 2800, as shown in FIG. 12.

Each of the semiconductor chips S1, S2, S3, and S4 may include cell structure CE1, CE2, CE3, and CE4, and pen structures PE1, PE2, PE3, and PE4. The cell structure CE1, CE2, CE3, and CE4 may include, for example, the first substrate 100 mentioned above using FIGS. 1 to 10. Also, as shown, the cell structures CE1, CE2, CE3, and CE4 may include mold structures MS1 and MS2, channel structure CH, bit line BL, block isolation region WLC, first through via 184, and contact via 190. The pen structures PE1, PE2, PE3, and PE4 may include, for example, the second substrate 200 mentioned above using FIGS. 1 to 10.

In some embodiments, each of the semiconductor chips S1, S2, S3, and S4 may include cell structures CE1, CE2, CE3, and CE4 and peri structures PE1, PE2, PE3, and PE4 bonded in the wafer bonding manner. For example, the cell structures CE1, CE2, CE3, and CE4 and the peri structures PE1, PE2, PE3, and PE4 may be connected by a copper-copper bonding (Cu to Cu bonding) process.

In some embodiments, the chip attachment film 400 may attach the semiconductor chips S1, S2, S3, and S4 onto the package substrate 2100. As an example, the chip attachment film 400 may attach the fourth semiconductor chip S4 onto the package substrate 2100.

In some embodiments, the chip attachment film 400 may be formed on the second side 100b of the first substrate 100 to attach the second cell structure CE2 and the third cell structure CE3. As an example, the chip attachment film 400 may attach the second cell structure CE2 and the third cell structure CE3.

In some embodiments, the second semiconductor chip S2 forms an overhang region on the third semiconductor chip S3 and may be stacked on the third semiconductor chip S3. For example, the stacked second semiconductor chip S2 and third semiconductor chip S3 may be in the form of a step. For example, the second semiconductor chip S2 may expose a part of the third semiconductor chip S3, and a part of the exposed third semiconductor chip S3 may have a shape protruding from one face of the second semiconductor chip S2.

The semiconductor chips S1, S2, S3, and S4 may be electrically connected to each other by the bonding wires 50a and 50b, and may be electrically connected to the package upper pads 2130 of the package substrate 2100. For example, each of the semiconductor chips S1, S2, S3, and S4 may be electrically connected to each other through the upper bonding wire 50a or the lower bonding wire 50b, or may be electrically connected to the package upper pads 2130 of the package substrate 2100.

As an example, the first semiconductor chips S1 and the third semiconductor chips S3 may be connected to the package upper pads 2130 through the upper bonding solder 40a and the upper bonding wire 50a connected to the upper input/output pad 30a. As an example, the second semiconductor chip S2 and the fourth semiconductor chip S4 may be connected to the package upper pads 2130 through the lower bonding solder 40b and the lower bonding wire 50b connected to the lower input/output pad 30b.

Figure 14:
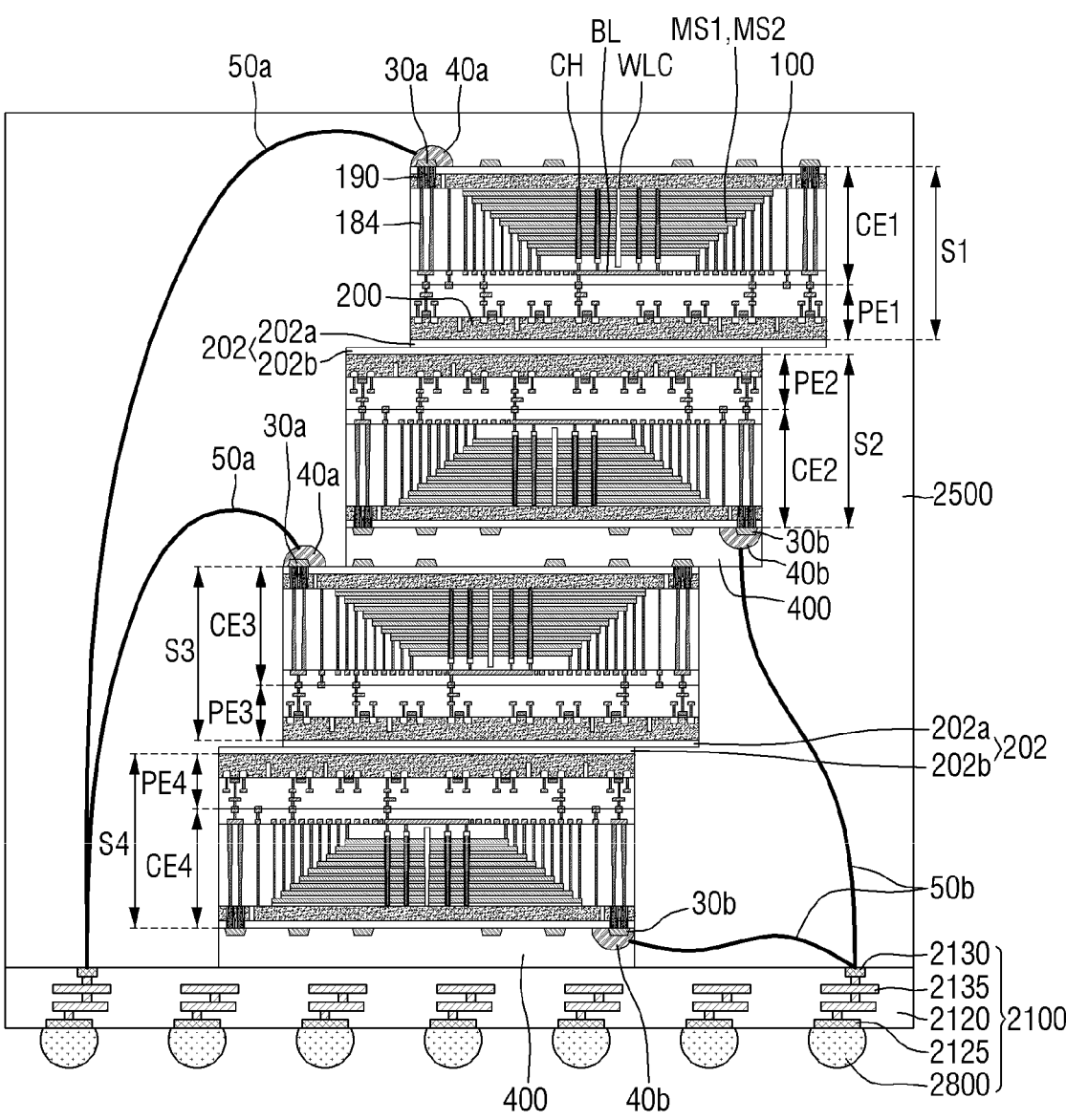
Figure 15:
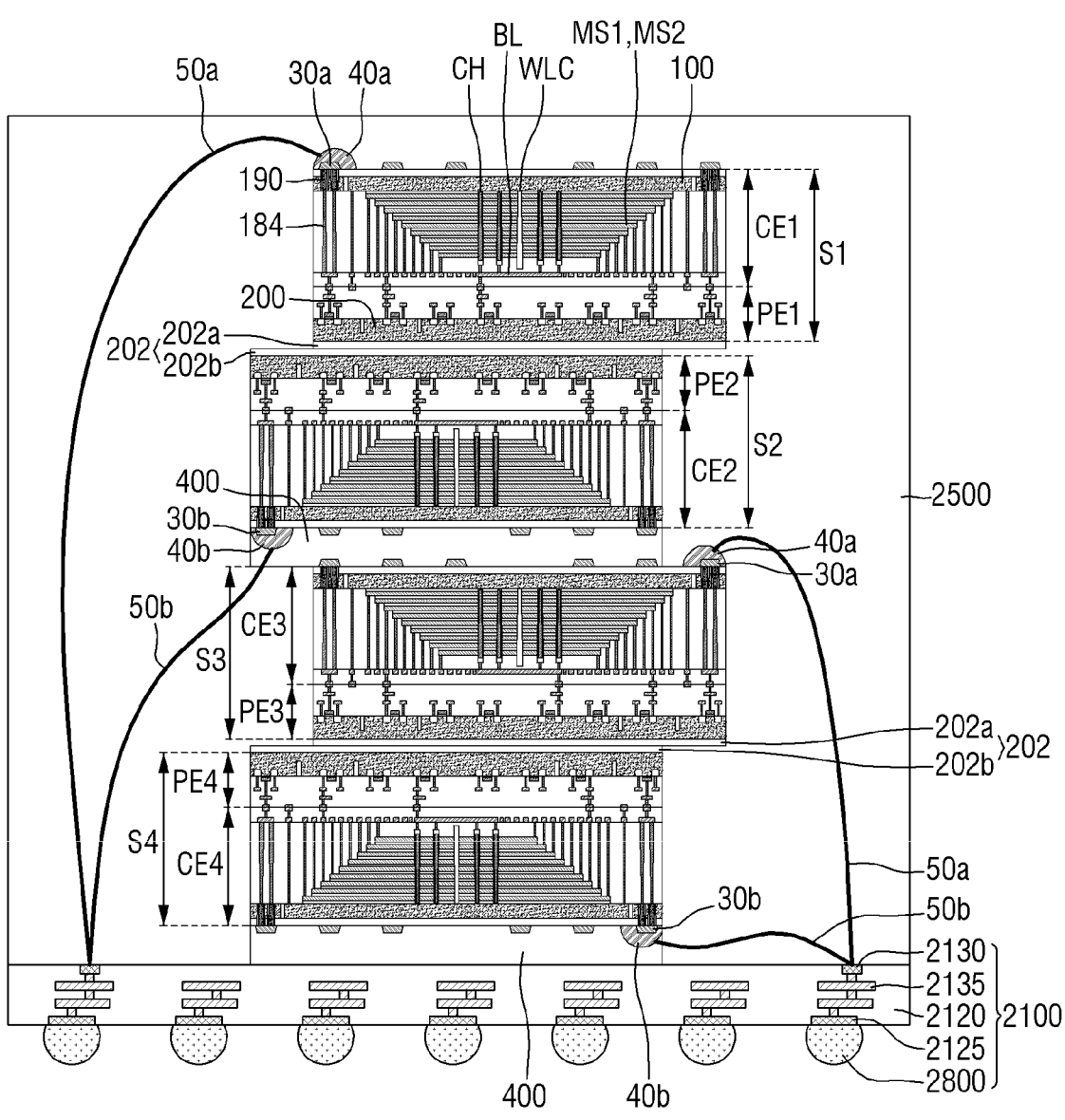

Referring to FIGS. 12, 14, and 15, in the electronic system 2000 according to some embodiments, each of the semiconductor chips S1, S2, S3, and S4 forms an overhang region, and may be stacked.

As an example, as shown in FIG. 14, the semiconductor chips S1, S2, S3, and S4 may be stacked in the form of a step. As another example, as shown in FIG. 15, the semiconductor chips S1, S2, S3, and S4 may be stacked in a zigzag form.

Although FIGS. 14 and 15 show that the first semiconductor chip S1 and the third semiconductor chip S3 are connected to the package upper pads 2130 through the upper input/output pad 30*a*, and the second semiconductor chip S2 and the fourth semiconductor chip S4 are connected to the package upper pads 2130 through the lower input/output pad 30*b*, these are only examples.

Figure 16:
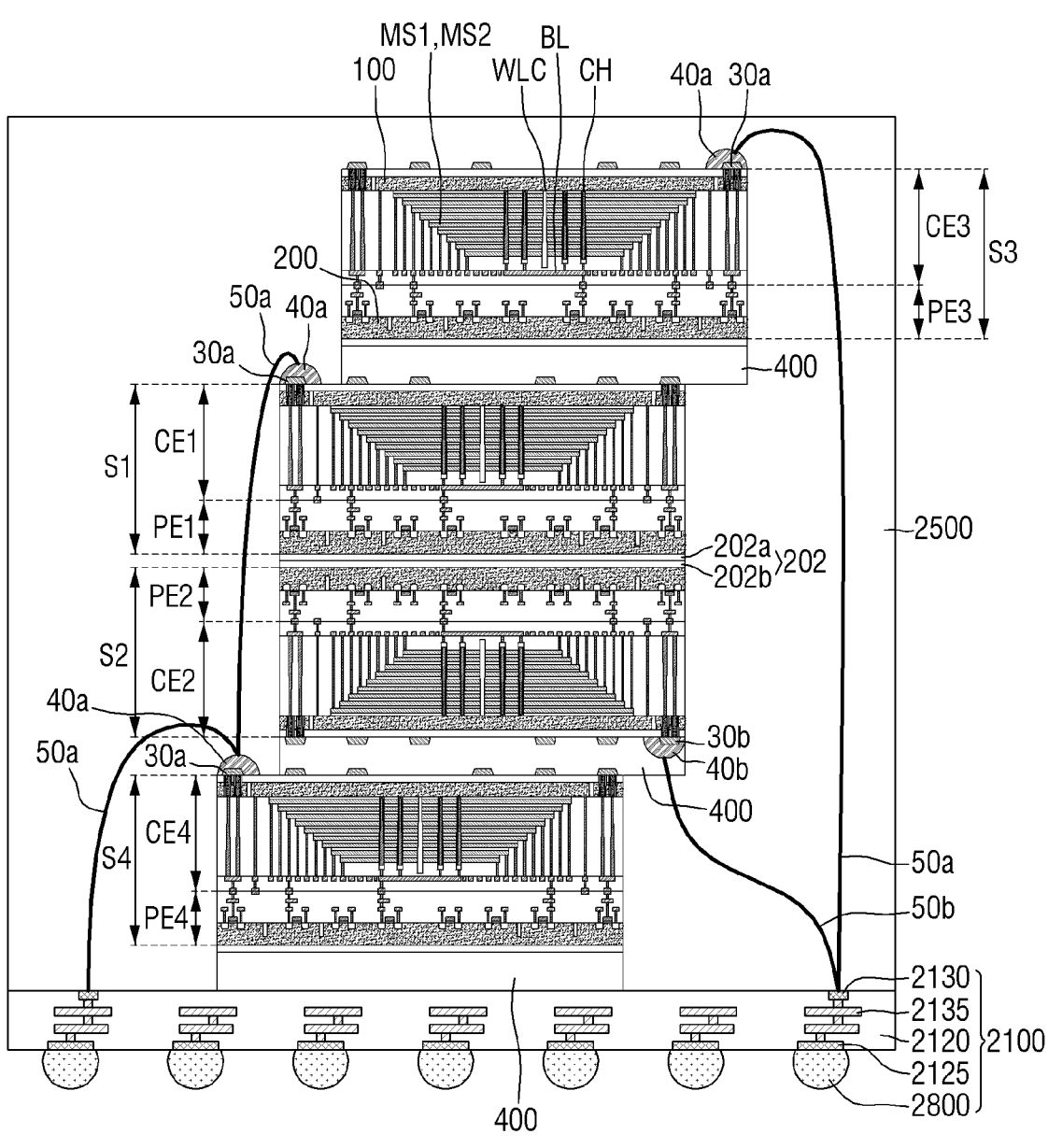
Figure 17:
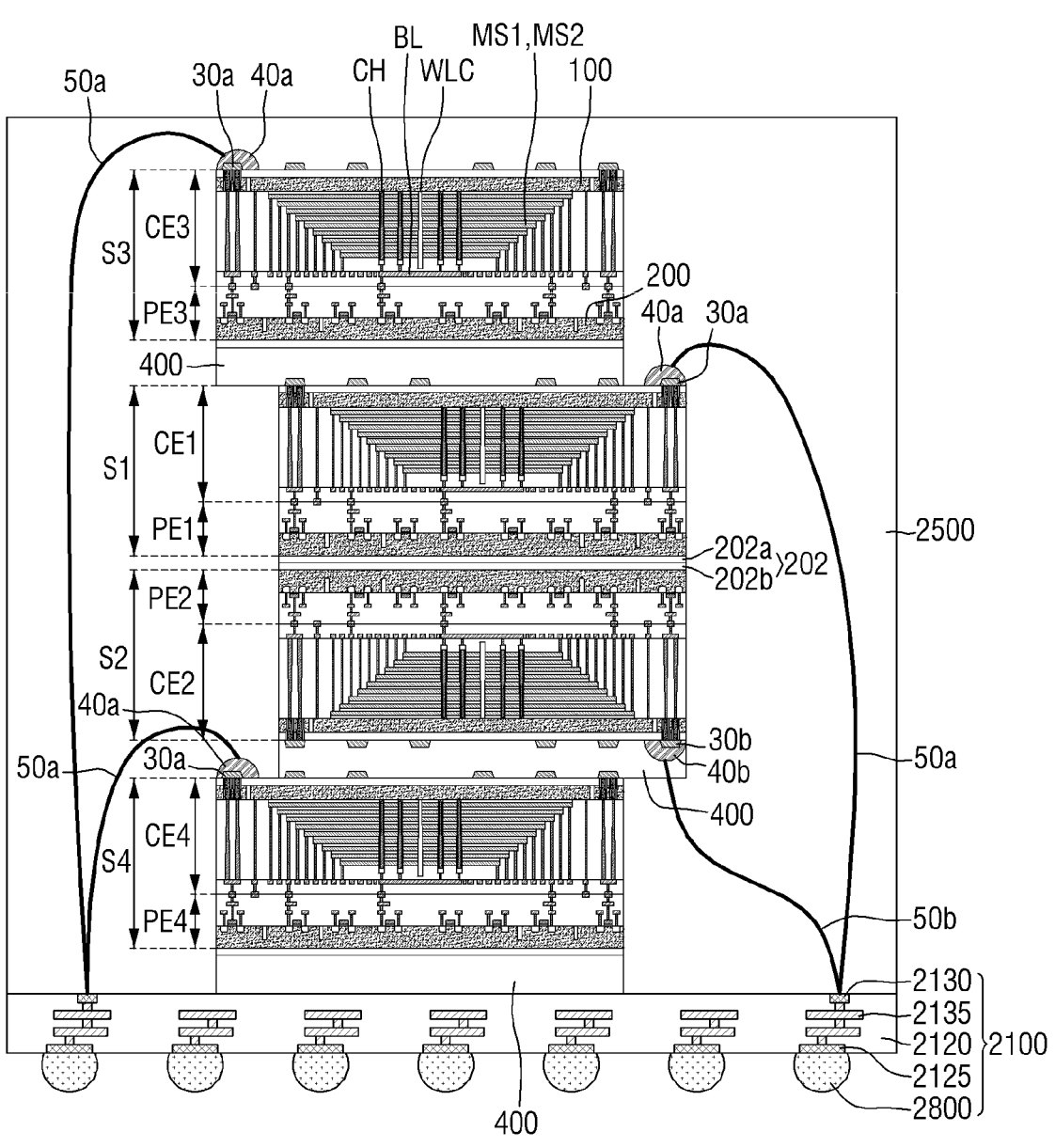

Referring to FIGS. 12, 16, and 17, in the electronic system 2000 according to some embodiments, the third semiconductor chip S3 and the fourth semiconductor chip S4 may be attached to the first semiconductor chip S1 or the second semiconductor chip S2 by the chip attachment film 400.

As an example, the chip attachment film 400 is interposed between the first semiconductor chip S1 and the third semiconductor chip S3, and may attach the first semiconductor chip S1 and the third semiconductor chip S3. Further, the chip attachment film 400 is interposed between the second semiconductor chip S2 and the fourth semiconductor chip S4, and may attach the second semiconductor chip S2 and the fourth semiconductor chip S4.

In some embodiments, the second semiconductor chip S2 may form an overhang region on the fourth semiconductor chip S4 and be stacked on the fourth semiconductor chip S4. For example, the stacked second semiconductor chip S2 and fourth semiconductor chip S4 may be in the form of a step.

In some embodiments, the third semiconductor chip S3 may form an overhang region on the first semiconductor chip S1 and be stacked on the first semiconductor chip S1. For example, the stacked third semiconductor chip S3 and the first semiconductor chip S1 may be in the form of a step.

Although FIGS. 16 and 17 show that the first semiconductor chip S1, the third semiconductor chip S3, and the fourth semiconductor chip S4 are connected to the package upper pads 2130 through the upper input/output pad 30*a*, and the second semiconductor chip S2 is connected to the package upper pads 2130 through the lower input/output pad 30*b*, these are only examples.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor memory device comprising:
a first semiconductor chip;
a second semiconductor chip attached to the first semiconductor chip; and
a substrate attachment film which attaches the first semiconductor chip and the second semiconductor chip,
wherein each of the first semiconductor chip and the second semiconductor chip includes:
a first substrate including a first side and a second side opposite to each other,
a mold structure including a plurality of gate electrodes stacked sequentially on the first side of the first substrate,
a channel structure which penetrates the mold structure and intersects the plurality of gate electrodes,
an input/output pad on the second side of the first substrate,
a second substrate including a third side facing the first side and a fourth side opposite to the third side, and a connection via penetrating the second substrate,
wherein the substrate attachment film includes:
a first attachment film which covers the fourth side of the first semiconductor chip,
a first attachment pad in the first attachment film,
a second attachment film which is attached to the first attachment film and covers the fourth side of the second semiconductor chip, and
a second attachment pad attached to the first attachment pad in the second attachment film,
wherein the first attachment pad is connected to the connection via of the first semiconductor chip, and
wherein the second attachment pad is connected to the connection via of the second semiconductor chip.

2. The semiconductor memory device of claim 1,
wherein each of the first semiconductor chip and the second semiconductor chip further includes a circuit element on the third side of the second substrate.

3. The semiconductor memory device of claim 1, wherein a width of the connection via decreases from the fourth side of the second substrate toward the third side of the second substrate.

4. The semiconductor memory device of claim 1, wherein the connection via includes a conductive pattern, and a spacer film extending along a side face of the conductive pattern to separate the conductive pattern from the second substrate.

5. The semiconductor memory device of claim 1,
wherein each of the first semiconductor chip and the second semiconductor chip further includes a contact via penetrating the first substrate and being connected to the input/output pad.

6. The semiconductor memory device of claim 5, wherein each of the first semiconductor chip and the second semiconductor chip further includes:
an interlayer insulating film which covers the mold structure on the first side of the first substrate; and
a first through via which penetrates the interlayer insulating film and is connected to the contact via.

7. The semiconductor memory device of claim 6, wherein the first through via is spaced apart from the mold structure.

8. The semiconductor memory device of claim 6, wherein each of the first semiconductor chip and the second semiconductor chip further includes a second through via which penetrates the interlayer insulating film and is connected to the first substrate.

9. A semiconductor memory device comprising:
a first semiconductor chip including an upper input/output pad;
a second semiconductor chip including a lower input/output pad; and
a substrate attachment film which attaches the first semiconductor chip and the second semiconductor chip,
wherein each of the first semiconductor chip and the second semiconductor chip further includes:
a first substrate which includes a first side facing the substrate attachment film and a second side opposite to the first side,
a mold structure including a plurality of gate electrodes stacked sequentially on the first side of the first substrate,
a channel structure which penetrates the mold structure and intersects the plurality of gate electrodes,
a contact via penetrating the first substrate,
a second substrate which includes a third side facing the first side and a fourth side opposite to the third side, a circuit element on the third side of the second substrate, and a connection via penetrating the second substrate, wherein the substrate attachment film includes:

a first attachment film which covers the fourth side of the first semiconductor chip, a first attachment pad in the first attachment film, a second attachment film which is attached to the first attachment film and covers the fourth side of the second semiconductor chip, and a second attachment pad attached to the first attachment pad in the second attachment film, wherein the upper input/output pad is placed on the second side of the first semiconductor chip and is connected to the contact via of the first semiconductor chip, and wherein the lower input/output pad is placed on the second side of the second semiconductor chip and is connected to the contact via of the second semiconductor chip.

10. The semiconductor memory device of claim 9, wherein each of the first semiconductor chip and the second semiconductor chip further includes:

an interlayer insulating film which covers the mold structure on the first side of the first substrate; and a through via which penetrates the interlayer insulating film and connects the circuit element and the contact via.

11. The semiconductor memory device of claim 10, wherein each of the first semiconductor chip and the second semiconductor chip further includes:

a first inter-wiring insulating film which covers the interlayer insulating film; and a second inter-wiring insulating film which is attached to the first inter-wiring insulating film and covers the circuit element.

12. The semiconductor memory device of claim 9, wherein each of the first semiconductor chip and the second semiconductor chip further includes:

a block isolation region which extends in a first direction and cuts the mold structure; and a bit line which extends in a second direction intersecting the first direction between the mold structure and the second substrate and is connected to the channel structure.

13. The semiconductor memory device of claim 9, wherein the channel structure includes a semiconductor pattern intersecting the plurality of gate electrodes, and an information storage film interposed between the semiconductor pattern and the mold structure.

14. The semiconductor memory device of claim 9, wherein a width of the contact via decreases from the second side of the first substrate toward the first side of the first substrate.

15. The semiconductor memory device of claim 9, wherein the contact via includes a conductive pattern, and a spacer film extending along a side face of the conductive pattern to separate the conductive pattern from the first substrate.

16. The semiconductor memory device of claim 9, wherein a width of the connection via decreases from the fourth side of the second substrate toward the third side of the second substrate.

17. The semiconductor memory device of claim 9, wherein the connection via includes a conductive pattern, and a spacer film extending along a side face of the conductive pattern to separate the conductive pattern from the second substrate.

18. An electronic system comprising:

a main board;

a semiconductor memory device on the main board; and a controller which is electrically connected to the semiconductor memory device on the main board, wherein the semiconductor memory device includes a first semiconductor chip, a second semiconductor chip attached to the first semiconductor chip, and a substrate attachment film which attaches the first semiconductor chip and the second semiconductor chip, wherein each of the first semiconductor chip and the second semiconductor chip includes:

a first substrate including a first side and a second side opposite to each other, a mold structure including a plurality of gate electrodes stacked sequentially on the first side of the first substrate, a channel structure which penetrates the mold structure and intersects the plurality of gate electrodes, an input/output pad on the second side of the first substrate, a second substrate including a third side facing the first side and a fourth side opposite to the third side, and a connection via penetrating the second substrate, wherein the substrate attachment film includes:

a first attachment film which covers the fourth side of the first semiconductor chip, a first attachment pad in the first attachment film, a second attachment film which is attached to the first attachment film and covers the fourth side of the second semiconductor chip, and a second attachment pad attached to the first attachment pad in the second attachment film, wherein the first attachment pad is connected to the connection via of the first semiconductor chip, and wherein the second attachment pad is connected to the connection via of the second semiconductor chip.

19. The electronic system of claim 18, wherein each of the first semiconductor chip and the second semiconductor chip further includes a circuit element on the third side of the second substrate.

20. The electronic system of claim 18, wherein each of the first semiconductor chip and the second semiconductor chip further includes a contact via penetrating the first substrate and being connected to the input/output pad.

* * * * *